US005638311A

United States Patent [19]
Fujii et al.

[11] Patent Number: 5,638,311
[45] Date of Patent: Jun. 10, 1997

[54] FILTER COEFFICIENT ESTIMATION APPARATUS

[75] Inventors: Kensaku Fujii; Juro Ohga, both of Kawasaki, Japan

[73] Assignee: Fujitsu Limited, Kanagawa, Japan

[21] Appl. No.: 538,446

[22] Filed: Oct. 3, 1995

[30] Foreign Application Priority Data

Oct. 28, 1994 [JP] Japan .................................. 6-265076

[51] Int. Cl.⁶ .................................................. G06F 17/10
[52] U.S. Cl. ............................................... 364/724.19
[58] Field of Search ........................ 364/72.19, 724.2; 379/406; 381/95

[56] References Cited

U.S. PATENT DOCUMENTS

| 4,468,640 | 8/1984 | Gritton . | |
| 4,998,241 | 3/1991 | Brox et al. | 379/406 |
| 5,278,780 | 1/1994 | Eguchi | 364/724.19 |
| 5,343,521 | 8/1994 | Jullien et al. | 379/406 |
| 5,483,594 | 1/1996 | Prado et al. | 379/406 |

OTHER PUBLICATIONS

J.G. Proakis, et al., "Introduction to Digital Signal Processing", Macmillan Publ. Co., NY, 1988, pp. 35–49; 429–458.

*Primary Examiner*—Tan V. Mai
*Attorney, Agent, or Firm*—Helfgott & Karas, PC.

[57] ABSTRACT

An estimation apparatus predicts filter coefficients for an adaptive filter, the response of which emulates the signal transmission characteristics of a known signal. The response thereto is sent to a signal transmission system of unknown characteristics, enabling execution of calculations without invalidating coefficient updating, even when there is a limit on the word length for processings. To achieve this, a sum of products calculation unit calculates the sum of products of the residual difference in response and the signal which is sent to the signal transmission system. A sum of squares calculating unit calculates the sum of the squares of the signal sent to the signal transmission system over a prescribed period of time. An updating amount calculation unit calculates the filter coefficient updating amounts from the ratio of the results from the sum of the products calculating unit to the results of the sum of the squares calculating unit. Filter coefficients are updated using the coefficient updating amounts calculated by the updating amount calculation unit.

14 Claims, 14 Drawing Sheets

(FIXED-POINT PROCESSING)

Fig. 13

| | LEARNING IDENTIFICATION ALGORITHM | BASIC FORM OF LMS METHOD | MOVING AVERAGE FORM OF LMS METHOD |
|---|---|---|---|
| COEFFICIENT UPDATING (ADDITIONS) | I | I *) | 1 |
| NORMALIZATION (DIVISION) | 1 | 1 *) | 1 |
| SQUARING OF Xj | 1 | 1 | 1 |
| RIGHT SHIFT OF SHIFT RESISTER IN WHICH SQUARED VACUES ARE STORED | 1 | — | — |
| DIFFERENCE BETWEEN OLD AND NEW SQUARED VALUES (SUBTRACTION) | 1 | — | — |
| ACCUMULATION OF SQUARED VALUES | 1 | I | 1 |
| ACCUMULATION OF SQUARED VALUES FOR NORM CORRECTION | 1 | — | — |
| CONTROL SIGNAL REQUIRED FOR EVERY I SAMPLING PERIOD | SWITCH | RESET | SET/RESET |
| INITIAL RESET | 1 | — | — |
| SHIFT REGISTER (I TAPS) | 1 | — | — |
| REGISTER | I+2 | 2I | 2I+2 |

*) EXECUTED IN UNITS OF SAMPLING PERIODS

FILTER COEFFICIENT ESTIMATION APPARATUS

BACKGROUND OF THE INVENTION

1. Field of the Invention

The present invention relates to an improvement of an apparatus for estimating coefficients for an adaptive filter which emulates signal transmission characteristics from a known signal, which is sent to a signal transmission system of unknown characteristics, and the response thereto.

A filter coefficient estimation apparatus according to the present invention can be applied, for example, to an apparatus which updates the coefficients of an adaptive filter used in an acoustic echo canceler or an active noise control system. The adaptive algorithm used to implement these apparatuses must, in addition to having convergence speed and stability and require a small amount of processing, must have low cost when its commercial use is considered.

2. Description of the Related Art

FIG. 1 and FIG. 2 show typical examples of apparatuses in which an improvement in operation is expected by the application of the present invention. The descriptions to follow use the examples of these apparatuses.

First, the apparatus shown in FIG. 1 is an apparatus known as a hands-free telephone which makes use of an acoustic echo canceler 200 which has the effect of reducing the acoustic coupling between a speaker 201 and a microphone 202, thereby enabling hands-free two-way communication. Specifically, this apparatus is made up of the acoustic echo canceler 200 and a signal transmission system 100, the signal transmission system 100 including a speaker 201, a microphone 202 which inputs the voice of the near-end talker, and the acoustic echo canceler 200 including an adaptive filter 220 which emulates the signal transmission system 100, a subtractor 210 which eliminates the echo from the signal picked up by the microphone 202, and a coefficient updating circuit 230 which performs updating of the coefficients of the adaptive filter 220.

In the apparatus shown in FIG. 1, the far-end talker's signal (corresponding to the above-noted known signal) Xj, which is sent to the signal transmission system, which includes the speaker 201, is the echo (corresponding to the above-noted response of the above-noted signal transmission system), which is fed back to the microphone 202.

$$gj = \Sigma hj(i) Xj(i) \quad (1)$$

In the above equation:
j: Time (sample time index, iteration)
$\Sigma$: Summation from i−1 to I
hj(i): i-th sample value of the impulse response hj (impulse response at the time i) of the signal transmission system (echo path) from the speaker to the microphone
Xj: i-th sample value of the far-end talker's signal Xj which is the echo (far-end talker's signal at the time j)
I: Delay time given by the largest sampling period detected as an echo The acoustic echo canceler cancels out this echo gj by subtracting from it an echo replica Gj expressed by equation (2), this being synthesized by a nonrecursive (Finite Impulse Response) adaptive filter 220, using the subtractor 210.

$$Gj = \Sigma Hj(i) Xj(i) \quad (2)$$

In doing this, the number of taps on the adaptive filter is equal to the maximum echo delay I.

The degree to which the echo is canceled as a result of this subtraction can be measured by the error between the filter coefficient Hj (i) of the adaptive filter, which is computed by the coefficient updating circuit 230, and the impulse response hj (i) which is established by the transmission characteristics of the signal transmission system 100, this error being expressed as given in equation (3).

$$\Delta j(i) = hj(i) - Hj(i) \quad (3)$$

The effect of using the acoustic echo canceler is maximum when the following difference (residual echo) is minimized.

$$Ej = \Sigma \Delta j(i) Xj(i) + Nj \quad (4)$$

In the above equation, Nj is periodic noise.

In the configuration example shown in FIG. 1, the coefficient updating circuit 230 is equivalent to the filter coefficient estimation apparatus of the present invention, this coefficient updating circuit 230 being configured as a filter having an impulse response which describes the characteristics of the signal transmission system 100, this being achieved by adjusting the filter coefficients Hj(i) of the adaptive filter 220 so that the above-noted difference Ej is a minimum.

The apparatus shown in FIG. 2 is known as an active noise control system, which eliminates, within a duct 300, the noise generated by a fan 305, the configuration of this apparatus including a detection sensor microphone 302 which collects noise, a noise-control filter 320 which generates pseudo-noise, a speaker 303 which outputs pseudo-noise, an error-sensor microphone 304 which collects the error which is the noise not eliminated, a feedback control filter 310 which emulates a feedback system, a coefficient updating circuit 340 which performs updating of the coefficients of the noise control filter 320, and an error path filter 330 which emulates the system from the noise control filter 320 to the coefficient updating circuit 340 via the error sensor microphone 304.

The principle of this active noise control system is that of outputting from the speaker 303 a pseudo-noise that has the same amplitude as, but the reverse phase to, the noise flowing in the duct 300 at the position of the error-sensor microphone 304, thereby canceling out the noise at the position of this microphone and reducing the noise that flows to the outside of the duct. However, in the description herein, it will be assumed that the feedback of pseudo-noise occurring in the system formed from the speaker 303 to the detection sensor microphone 302, this system being not directly related to the present invention, is completely canceled out by the output of the feedback control filter 310.

In this apparatus, the above-noted "signal transmission system of unknown characteristics" corresponds to the noise transmission system from the detection sensor microphone 302 to the error-sensor microphone 304, the signal being sent to the signal transmission system corresponds to the fan noise Xj that is collected by the detection sensor microphone 302, the filter that emulates the characteristics of the signal transmission system is the noise control filter 320, and the coefficient updating circuit 340 corresponds to the filter coefficient prediction apparatus of the present invention.

In this active noise control system, the coefficient updating circuit 340 adjusts the coefficients Hj of the noise control filter 320 so that the output ej of the microphone 304 is a minimum. In this condition, the radiation of noise to the outside of the duct is also a minimum.

The problem is the configuration of the coefficient updating circuit which computes the filter coefficients Hj. There have been, of course, a variety of proposed methods, each with its own characteristics. However, in considering the practical implementation of the apparatus, the configuration method should have the following characteristics.

Specifically, the configuration should be such that:
(a) each intermediate computation result should be neither larger than nor smaller than a limit imposed by the computation word length,
(b) stable operation should be guaranteed,
(c) the amount of computation performed should be small, and
(d) if possible, convergence should be fast.

In the past, the most typical algorithm for predicting coefficients for an adaptive filter which emulates the signal transmission characteristics from a known signal and the response thereto which are sent to a signal transmission system of unknown characteristics is the LMS method, shown below.

$$H_{j+1}(m)=Hj(m)+\mu Ej\, Xj(m) \qquad (5)$$

m: Indicates the m-th tap on the adaptive filter

In the above relationship, $\mu$ is known as the step gain, the range of which is established in terms of the power function of the signal Xj which is sent to the signal transmission system. For example, when this power of the signal is large, the upper limit of $\mu$ for which coefficient updating can be performed stably becomes small, and when this power is small, this upper limit becomes large. Therefore, in practical applications, the value of $\mu$ is fixed at a value which does not exceed the upper limit in the case of the largest envisioned power. The convergence speed is known to be faster the larger the step gain is. For this reason, when the step gain is set in accordance with the maximum power of the signal Xj, since in normal operation the power of this signal is not maximum, the convergence speed results in unnecessarily slow convergence for the great majority of time during which the power of this signal is small.

This problem is solved by the application of a normalized learning identification method (the normalized least mean square (NLMS) method) in which the second term of Equation (5) is normalized with respect to the norm $[\Sigma Xj^2 (i)]$ of the signal sent to the signal transmission system, this being expressed by Equation (6).

$$H_{j+1}(m)=Hj(m)+KEj\, Xj(m)/\Sigma Xj^2(i) \qquad (6)$$

This learning identification method is widely known as an algorithm that is suitable for application to an apparatus, such as the acoustic echo canceler shown in FIG. 1, in which a voice signal having sharp amplitude variations is sent to the signal transmission system.

The applicability of an adaptive algorithm to the implementation of an acoustic echo canceler or active noise control system as described above is judged based on such performance parameters as high-speed convergence, stability, and small amount of computation performed, and at present the above-described learning identification algorithm is an algorithm which has a performance in these areas which allows practical use. However, study and work on improving the performance of this learning identification algorithm, and in particular in achieving fast convergence, is continuing.

Once satisfactory performance is achieved, and the development of these apparatuses reach the product stage, another factor, that of low cost, becomes significant. With respect to the demand for low cost, the approach of implementing the learning identification algorithm with fixed-point processing provides an effective solution. Firstly, it enables the use of a low-cost signal processor, and secondly, the significant improvement in processing speed enables a reduction in production costs by enabling the duct used for noise reduction to be made even smaller.

The problem that arises is one of whether the updated quantities that are computed and added to the adaptive filter coefficients each sampling period are smaller or larger than the limits imposed by the word length used for fixed-point processing. In the learning identification algorithm, this problem arises because, due to the normalization by the norm value, the coefficient updating values are held to within the reciprocal of the tap number (when the step gain K is less than 1, K times that value). That is, the problem occurs because of the facts that, in Equation (6), the norm $[\Sigma Xj2 (i)]$ increases proportionally with an increase in the number of the tap I, and the numerator Ej Xj (m) decreases as the coefficient updating proceeds. When using a low-cost processor or computing filter coefficients Hj using fixed-point quantities in order to achieve fast computation (reduction in the number of processors), a large denominator and a small numerator cause the second term of Equation (6) to be smaller than the word length limit, thereby making the updating invalid.

If the update value is smaller than the word length limit, of course, the coefficient of the adaptive filter will not be updated. The possibility of this occurring is large if the number of taps on the adaptive filter becomes large or if the step gain is set to a small value because of a high level of ambient noise, and the larger this possibility is, the slower will be the convergence. In addition, if the error becomes small as the coefficient updating proceeds, there can be a loss of digits in the update values, so that further updating is impossible, thereby imposing a limit on the improvement of the estimation accuracy.

What follows is a further detailed description, in accordance with Equation (6), of the problems associated with using fixed-point processing with the learning identification algorithm in predicting adaptive filter coefficients. In Equation (6), the errors occurring when this equation is executed using fixed-point processing are separated into the component caused by the first term and the component caused by the second term. Specifically, the component associated with the first term, Hj(m) is equal to the part smaller than the word length limit which is discarded when the impulse response hj(i) (I=1 to I) of the echo path is converted to fixed point. Therefore, it is possible to limit the associated error component by carefully adjusting the gain of the amplifier, which is related to the far-end talker's signal Xj and the microphone output Yj (=gj+Sj+Nj, where Sj is the near-end talker's signal) thereby achieving an amplitude distribution so that the adaptive filter coefficients Hj(m) are sufficiently larger than the word length limit. If this level distribution is properly achieved, the influence of implementing the computation of the coefficients Hj of the adaptive filter using fixed-point processing can be ignored from a practical standpoint.

The problem lies with the component associated with the second term. To clearly identify the influence of fixed-point processing of the second term on the prediction error, first the residual echo Ej of Equation (4) is calculated from the echo gj of Equation (1) and the echo replica Gj of Equation (2), after which the m-th tap component is separated from the residual echo, and the numerator of the second term of Equation (6) is changed as follows.

$$E_j X_j(m) = [h_j(m) - H_j(m)] X_j^2(m) + (\Sigma_m \Delta_j(i) X_j(i) + N_j] X_j(m)$$

$\Sigma_m$: Summation from $i = 1$ to $I$, excluding $i = m$

It is clear that update value for the m-th tap coefficient of the adaptive filter to be computed is given by the difference between the impulse response hj(m) of the echo path and the coefficient Hj(m) of the adaptive filter, this difference being expressed as follows.

$$\Delta j(m) = hj(m) - Hj(m)$$

However, in the learning identification algorithm, the quantity $Dj(m) = \Delta j(m) KXj^2 (m)/\Sigma Xj^2 (i)$, which is obtained by substituting the above-noted Ej Xj (m) into Equation (6), is treated as the coefficient updating value. This causes a problem. Specifically, in fixed-point processing in which the smallest quantity expressible is $2^{-M}$, if the coefficient updating value becomes $Dj(m) < 2^{-M}$, it is clear that the coefficient updating will not be executed. The smaller the step gain k becomes and the greater the number of taps I the adaptive filter has, the greater is the probability that the coefficient updating value Dj(m) is smaller than the word length limit. If this probability becomes large, of course, convergence is delayed, and if because of the above-noted $Dj(m) < 2^{-M}$ limitation only large estimation errors Dj(m) are used in updating, it is not possible to achieve high estimation accuracy.

FIG. 3 shows the convergence in the case in which all computations for Equation (6) are performed as floating-point operations, and a comparison with the convergence behavior for the case in which, after computing the second term using floating-point processing conversion is made to 16-bit fixed-point form before adding to the coefficient Hj(m). In the cases of both characteristics, the conversion between the analog signal and the digital is done as a linear 16-bit conversion, the number of taps I of the adaptive filter is 512, the step gains are the three values 0.01, 0.005, and 0.0025, and the power ratio of the echo to the environmental noise is 10 dB. The conversion from floating point to fixed point is performed by truncating the part of the values below the word length limit.

As is clear from the results shown in FIG. 3, in spite of the fact that the simplest computing method, that of "converting to fixed point after doing a floating-point processing of the second term," is used, the coefficient updating by fixed-point operations using the learning identification algorithm caused delay in convergence, given an example of a case in which it would not be possible to achieve a high estimation accuracy. From these results, it is verified that the selection of a small step gain has, on the contrary, a reverse effect with respect to the echo cancellation amount.

These phenomena occur in the same manner in the filtered-X LMS algorithm which is used in the active noise control system shown in FIG. 2, and are expressed as follows.

$$H_{j+1}(m) = Hj(m) + \mu ej Yj(m) \quad (7)$$

Yj: Prediction dispersion filter 330 output
ej: Microphone 304 output

They also occur in the same manner the filtered-X NLMS algorithm in which normalization to the output norm from the error path filter 330 is performed, and are expressed as follows.

$$H_{j+1}(m) = Hj(m) + KejYj(m)/\Sigma Yj^2(i) \quad (8)$$

Because the above-noted normalization by a norm value is intrinsic to the principle configuration of the learning identification algorithm, it is difficult to solve problems which derive from this principle by merely performing scaling operations. Therefore, a solution in terms of an improvement in the algorithm itself is desirable.

SUMMARY OF THE INVENTION

In consideration of the above-described problems with the prior art, an object of the present invention is to enable the implementation of a filter coefficient updating apparatus for an adaptive filter which is capable of executing updating without processing invalid updating, even when there is a limit to the length of the word used in the computations.

FIG. 4 illustrates the principle of the present invention.

To solve the above-noted problems, the present invention provides a prediction apparatus which estimates filter coefficients for a filter with a response that is equivalent to the signal transmission characteristics from a known signal, and the response thereto, which are sent to a signal transmission system of unknown characteristics, this apparatus comprising a sum of products calculating means 110 which accumulates, over a prescribed period of time, the product of the difference between the above-noted signal transmission system response and the above-noted filter response and the above-noted signal sent to the signal transmission system, a sum of the squares calculating means 120 which accumulates, over the above-noted prescribed period of time, the sum of the squares of the above-noted signal sent to the signal transmission system, and a updating amount calculating means 130 which calculates the above-noted filter coefficient updating amounts from the results of the sum of the products calculating means and the results of the sum of the squares calculating means, the filter coefficient updating amounts calculated by the above-noted updating amount calculating means being used to update the filter coefficients.

The prediction apparatus of the present invention estimates coefficients by focusing on the fact that the value to be extracted as a coefficient updating value is the "difference between the impulse response of the unknown signal transmission system to be identified and the estimated value thereof." That is, utilization is made of the fact that, if coefficient updating values can be added as is, without the differences becoming small as in the identification method, the number of significant digits of the updating values can coincide with the number of significant digits of the adaptive filter, even if fixed-point processing is done, that is, the fact that problems do not arise because of lost digits. Specifically, in the present invention, this is determined as the ratio of the sums obtained by integrating both the product of the above-noted "difference between the impulse response and the predicted value thereof" and the signal sent to the signal transmission system, and the square of the signal sent to the signal transmission system, with respect to time. By doing this, the term of the expression used to calculate the coefficient updating which causes estimation error can be reduced, by the effect of arithmetic averaging, to a degree that is the reciprocal of the number of integrations, while in comparison with the previous learning identification method, the term corresponding to the coefficient updating value, because the division by means of the sum of the squares calculation is not included, does not of course exhibit a reduction in the number of significant digits caused by such a division, thereby eliminating the possibility that the coefficient updating will not be executed.

In the above-described prediction apparatus, the above-noted sum of the squares calculating means is configured to have a shift register which sequentially stores the squares of the signal sent to the above-noted signal transmission system, each output tap of this shift register being accumulation summed to calculate the filter coefficients at each tap.

By using this type of configuration, there is a reduction of one sum of the squares calculation of the signal sent to the signal transmission system per sampling period, enabling a reduction in the amount of computation required.

In the above-described predicting apparatus, the configuration can be made such that the filter coefficient updating is performed for the filter coefficient for one tap for each sampling period of a prescribed number of filter updates (for example 1).

By using the above-noted configuration, because it is possible to perform the updating of adaptive filter coefficients in the above-noted units of time, it is possible, for example, to change the configuration to one in which one configuration updating is performed each sampling period, thereby distributing the calculation processing for coefficient updating over each sampling period, this reducing the amount of calculation done at any one time.

Furthermore, in the above-noted prediction apparatus, the above-noted sum of the squares calculating means can be configured so as to have a shift register which stores the accumulated sum of the squares of the above-noted signal only at times corresponding to the taps of the above-noted filter, the filter coefficients for each tap of the above-noted filter being updated based on the contents of the above-noted shift register.

By using this type of configuration, it is not necessary to perform the calculation of the sum of the square of the signal sent to the signal transmission system at each sampling period, thereby reducing the amount of processing performed at each sampling period.

In addition, in the above-noted prediction apparatus, it is possible to have a configuration in which, rather storing the sum of the squares of the signal sent to the signal transmission system, the reciprocals thereof are stored in the above-noted shift register.

By using this type of configuration, by multiplying the reciprocals it is possible to perform an operation equivalent to division, thereby eliminating the division, and because multiplication involves less calculation that division, this reduces the amount of calculations performed.

In the above-described prediction apparatus, the configuration can be made such that the above-noted prescribed period of time for execution of the sum of the products is established as the time at which the sum of the squares of the signal sent to the signal transmission system reaches a pre-established value.

By using the above-noted configuration, it is possible to achieve the required echo reduction amount, even if the power of the signal sent to the signal transmission system is reduced, and the prescribed time period over which the summation is performed can be shortened (that is, updating of coefficients can be performed frequently) within the range in which this echo reduction amount can be achieved, this enabling a increase in the speed of convergence.

Additionally, in the above-described prediction apparatus, the configuration can be made such that the product of the step gain and the adaptive filter number of taps can be established as the lower limit with respect to the number of summations appropriate to the above-noted prescribed time for accumulation of the sum of the squares of the signal sent to the signal transmission system.

In the above-described prediction apparatus, it is possible to have a configuration that has a shift register which stores values related to the sum of the squares calculated by the above-noted sum of the squares calculating means and a means for performing writing control of the values related to the above-noted sum of the squares when a non-execute command (for example, 0) is encountered in the above-noted shift register in the case in which the sum of the squares calculated by the above-noted sum of the squares calculating means does not reach a prescribed value, the updating of the coefficients of each of the taps of the above-noted filter being executed by monitoring the tap outputs of the shift register, execution being done when the contents thereof are a value related to the sum of the squares, and execution not being done when the contents thereof are a non-execute command. In the above, a value related to the sum of the square can be the sum of the squares itself, a prescribed reference value, or the reciprocal thereof.

By using this type of configuration, it is possible to simplify the calculation of the sum of the squares of the signal sent to the signal transmission system.

Furthermore, in the above-described prediction apparatus, the configuration can be such that a shift register is provided as a device to provide notification of the time to execute the sum of the product accumulation, this shift register storing a flag that is set at the point at which the sum of the squares of the above-noted signal reaches a pre-established value, this flag enabling the determination the timing for the updating of the filter coefficients, the coefficients being updated by dividing by the pre-established value of the sum of the squares or by multiplying by the reciprocal thereof.

By using this type of configuration, it is possible to simplify the calculation of the sum of the squares of the signal sent to the signal transmission system, and to simplify, for example, the hardware configuration.

In addition, in this prediction apparatus, it is possible to have a configuration such that the constants for multiplication or division are given in the form $2^k$ or $2^{-k}$.

By using this configuration, it is possible to execute the calculation by a shift operation, thereby reducing the amount of processing performed.

Furthermore, in the above-described prediction apparatus, it is desirable to have the configuration such that the step gain is established such that the ratio of the maximum value of the result of summing of the squares of the signal sent to the signal transmission system a number of times which is equal to the number of taps of the adaptive filter to the product of the expected sum of the squares for the desired prediction accuracy and the step gain is an integer, a register being provided for writing the sum of the squares of the signal sent to the signal transmission system required for the coefficient updating or the reciprocal thereof, the contents of this register being updated every I sampling periods which corresponds to the number of taps I of the above-noted adaptive filter, and the execution being executed in the case in which, at the time of the updating of the register contents, the sum of the squares of the signal sent to the signal transmission system has either reached or exceeded the above-noted maximum value.

In addition, in this prediction apparatus, it is desirable to have the configuration such that all of the sums of the squares stored into the above-noted register are given as multiples of the above-noted maximum value.

In the above-described prediction apparatus, it is desirable to have the configuration, in which such overflow monitoring is performed of the sum of the products of the products calculating means and the sum of the squares of the sum of the squares calculating means, or of the above-noted sum of the squares only, the sum of the products and the sum of the squares being halved when overflow of a monitored quantity is either predicted or detected, subsequent components to be added being multiplied by $½^k$ that is established by the number of predicted or detected times k.

By using this configuration, it is possible to avoid erroneous operation caused by an overflow of accumulated values.

BRIEF DESCRIPTION OF THE DRAWINGS

The present invention will be more clearly understood form the description as set forth below, with reference being made to the accompanying drawings in which:

FIG. 13 shows a comparison of the amount of computation in the learning identification algorithm and the present invention;

DESCRIPTION OF THE PREFERRED EMBODIMENT

A preferred embodiment of the present invention will be described in detail below, with reference being made to the related accompanying drawings.

Figure 5:
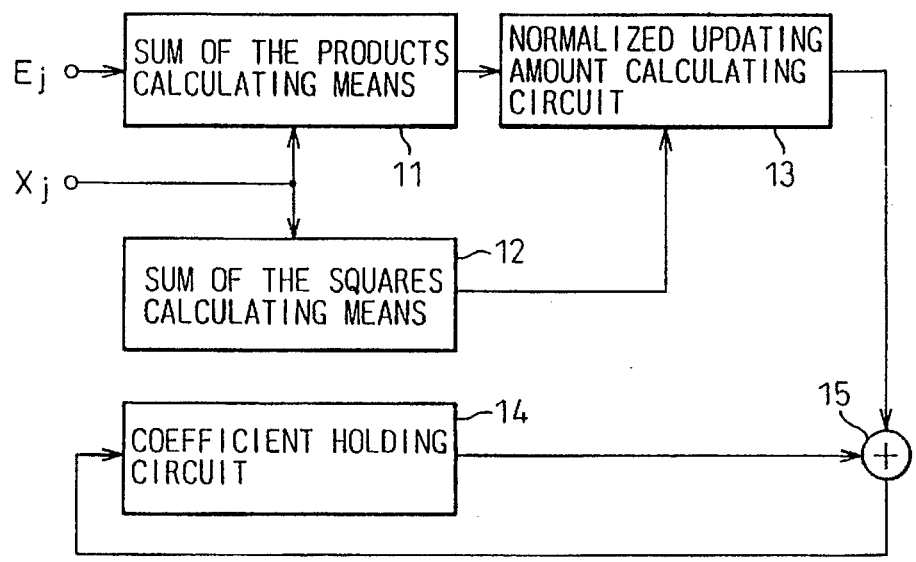
FIG. 5 is a drawing which shows an embodiment of the filter coefficient prediction apparatus of the present invention in the form of a coefficient prediction circuit of an acoustic echo canceler.

FIG. 5 shows an embodiment of the present invention in the form of a filter coefficient prediction apparatus. In the apparatus of this embodiment, the above-noted example of the application of the present invention to an acoustic echo canceler of a hands-free telephone is shown, the coefficient updating circuit 230 of the hands-free telephone being implemented using the present invention. Therefore, in the apparatus of this embodiment, the far-end talker's signal Xj and the residual echo Ej from the subtractor 210 are input as input signals, and the updated coefficient $H_{n+1}$ is output as the output signal to the adaptive filter 220.

In FIG. 5, the basic configuration of the coefficient updating circuit is such that Ej is the residual echo from the subtractor 210, which is the difference between the echo gj from the signal transmission system and the echo replica $G_1$ which is synthesized by the adaptive filter 220, and Xj is the far-end talker's signal Xj from the circuit side. In this drawing, the reference numeral 11 denotes a sum of the products circuit which, over a fixed period of time only, sums the products of the above-noted residual echo Ej and the far-end talker's signal Xj sent to the signal transmission system, 12 is a sum of the squares circuit which, over the above-noted fixed period of time only, sums the squares of the far-end talker's signal Xj which is sent to the signal transmission system, 13 is an updating quantity calculating circuit which calculates updating amounts from the ratio of the outputs of the circuits 11 and 12, 14 is a holding circuit which holds the filter coefficients Hj which was updated the previous time, and 15 is an adder which calculates the new filter coefficient $H_{n+1}$ by adding that updating quantity to the previous filter coefficient $H_n$ which was stored in the holding circuit 14.

The operation of the apparatus of this embodiment is described below.

First, the coefficient updating means of the learning identification algorithm is modified as follows. Specifically, coefficient updating is performed every J sampling periods, during which period J sums of the EjXj(m) and $Xj^2$ with regard to the m-th tap of the adaptive filter are taking along the time axis, this resulting in the sums of the products at the n-th block as follows.

$$A_n(m) = \Sigma^* EjXj(m) \qquad (9)$$

$$P_n(m) = \Sigma^* Xj^2(m) \qquad (10)$$

$\Sigma^*$: Summation from J=nJ+1 to (n+1)J (that is, summation J times, this notation being followed hereinafter)

The above sums of the products are used to update the filter coefficient as follows (as recited in claim 1).

$$H_{n+1}(m) = H_n(m) + KA_n(m)/P_n(m) \qquad (11)$$

In the above, n is the number of times from the start of coefficient updating each J sampling periods (that is, the block number).

Figure 6:
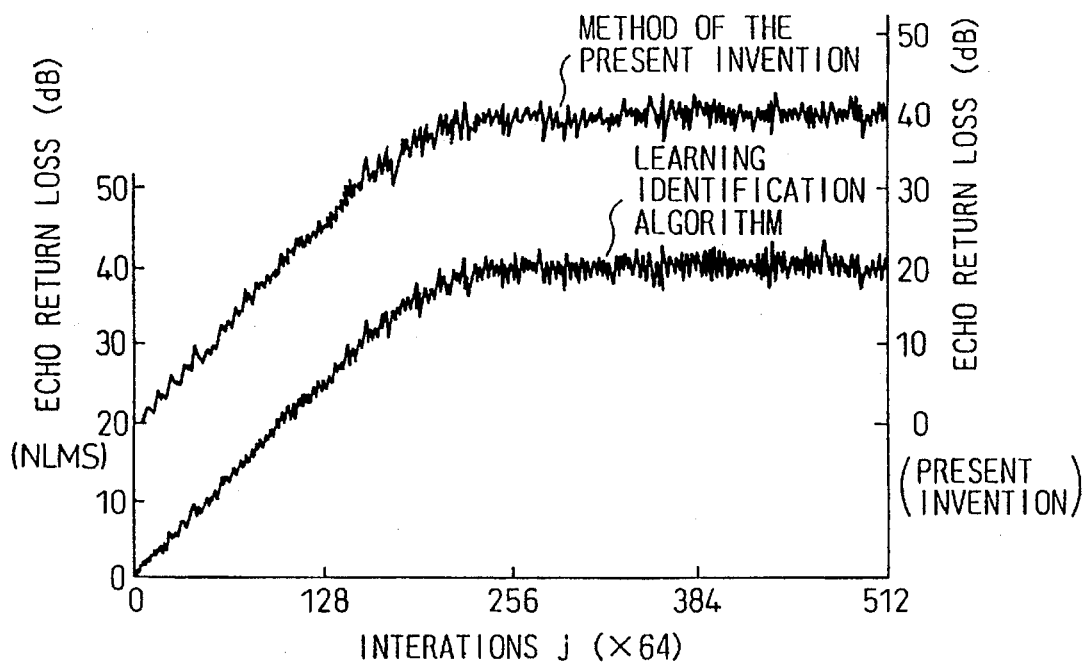
FIG. 6 is a drawing which shows the results of a simulation which compares the convergence characteristics of the apparatus of an embodiment of the present invention with those of the learning identification algorithm of the prior art.

FIG. 6 is a simulated comparison of the convergence characteristics of the present invention with those of the prior art learning identification algorithm, with the period J for execution of the coefficient updating set to be equal to the number of taps on the adaptive filter. In the results of this simulation, it can be seen that there is almost no difference in convergence characteristics between the two. However, because the convergence characteristics virtually coincide and defy mutual distinction, the convergence characteristics for the present invention are offset by 20 dB. In the simulation shown in FIG. 6, the convergence characteristics are calculated for a number of taps of the adaptive filter and an echo path impulse response length of I=512, a step gain of K=0.2, and an echo-to-environmental noise ratio of 30 dB. The echo reduction amount is indicated as the average value obtained by averaging over 64 sampling periods.

Figure 7:
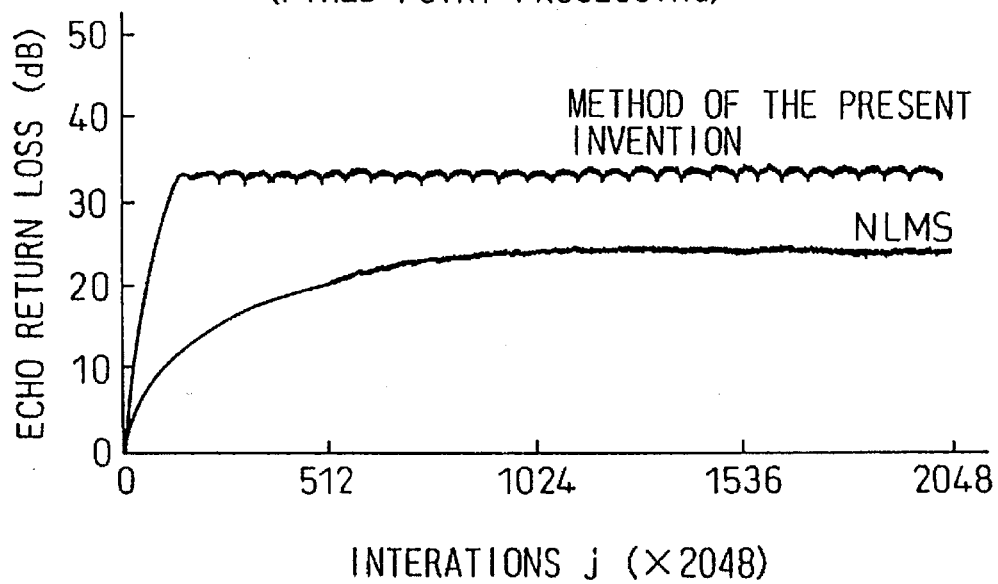
FIG. 7 is a drawing which shows the convergence characteristics of the embodiment apparatus obtained using fixed-point computation.

In the same manner, FIG. 7 is an example of the convergence characteristics with a number of taps I=512, number of summations J=512, a step gain K=0.1, and an echo-to-environmental noise ratio of 10 dB, with all computations executed as 16-bit fixed-point processings. In these results, it can be seen that convergence characteristics equivalent to those obtained with the learning identification algorithm and floating-point processing, and that the convergence characteristics are greatly improved with respect to those obtained with the learning identification algorithm using fixed-point processing.

In the method of the present invention, the reason for the effectiveness of the coefficient updating can be explained as follows. Specifically, the form is changed as follows.

$$E_j X_j(m) = [\Sigma \Delta_j(i) X_j(i) + N_j] X_j(m) \quad (12)$$

$$= \Delta_j(m) X_j^2(m) + [\Sigma_m \Delta_j X_j(i) + N_j] X_j(m)$$

$\Sigma_m$: Summation from $i = 1$ to $i = I$, excluding $i = m$ (this notation conformed to hereinafter)

By making this transformation, it is clear that the information required for the m-th coefficient update of the adaptive filter is in the first term of the above equation, which is as follows.

$$\Delta j(m) X_j^2(m) = [h i(m) - H j(m)] X_j^2(m) \quad (13)$$

It is further clear that the information to be extracted is $[hj(m)-Hj(m)]$.

Next, the coefficient updating is executed every J sampling periods, and because during the time j=nJ+1 to (n+1)J, the filter coefficients are not updated, but rather remain fixed, the adaptive filter coefficient Hj(m) is predicted as the constant $H_n(m)$, and because it is possible to assume that the characteristics of the signal transmission system (the impulse response of the echo path) do not change while the filter coefficient is converging and can be assumed to be constant $[h(m)=hj(m)]$, if the m-th tap component is separated, the $A_n(m)$ of the above-noted Equation (9) can be rewritten as follows.

$$A_n(m) = \Sigma^* \Delta_j(m) X_j^2(m) +$$
$$\Sigma^*[\Sigma_m \Delta_j(i) X_j(i) + N_j] X_j(m) \quad (14)$$
$$= \Sigma^*[h(m) - H_n(m)] X_j^2(m) +$$
$$\Sigma^*[\Sigma_m \Delta_j(i) X_j(i) + N_j] X_j(m)$$
$$= [h(m) - H_n(m)] \Sigma^* X_j^2(m) +$$
$$\Sigma^*[\Sigma_m \Delta_j(i) X_j(i) + N_j] X_j(m) \quad (15)$$

$\Sigma^*$: Summation from $J = nJ + 1$ to $(n + 1)J$

Because the first term of Equation (15) is the product with the far-end talker's signal power $P_n(m)$ given by Equation (10), it is clear that it is possible to extract the information required for the updating (difference between the true value and the predicted value) as the first term, expressed as follows, by taking the ratio of this equation with the power $P_n(m)$ (that is, by normalizing with respect to the power $P_n(m)$).

$$A_n(m)/P_n(m) = [h(m) - H_n(m)] + \Sigma^*[\Sigma^*_m \Delta_j(i) X_j(i) + N_j] X_j(m)/\Sigma^* X_j^2(m) \quad (16)$$

$\Sigma^*$: Summation from $J = nJ + 1$ to $(n + 1)J$

It can be seen that the effect of the arithmetic averaging in the present invention is to reduce the second term of Equation (12), which is a cause of estimation error, by a factor of 1/J. That is, the convergence speed of the method of the present invention can be thought of being approximately the same as the learning identification algorithm as shown in FIG. 6 because of this arithmetic averaging effect.

Because of this effect, the updating quantities in the present invention are expressed by multiplying the first term of Equation (16) by the step gain K, thus yielding the form $F_n(m)=K[h(m)-H_n(m)]$. It is clear that in contrast with the updating value Dj(m) of the learning identification algorithm, in the present invention there is no division by a norm. Without the division, of course, the reduction in the number of significant digits caused by this division does not occur, thereby eliminating the possibility that the coefficient updating will not be executed.

As can be seen by the fact that the updating quantity is extracted as $[h(m)-H_n(m))]$, because the numerator $A_n(m)$ which generates the updating quantity becomes equal to the denominator $P_n(m)$, the coefficient updating quantities can be determined without regard to an increase in the power thereof or an increase in the number of taps of the adaptive filter. That is, the problem of updating becoming invalid when the updating quantity is smaller than the limited word size, which is associated with the learning identification algorithm, is solved by the method of the present invention.

Next, in applying the method of the present invention to an actual apparatus, because it is desirable, in terms of design approach, that there be a verification of the conditions, that is, the actual range of step gain, under which stable operation is guaranteed, we will discuss the stability conditions. In doing so, we will follow the procedure used to arrive at stability conditions for the recursive filter representation of the learning identification algorithm.

First, Equation (16) is substituted into Equation (11) to obtain an expression of the updating expression for the present invention as $H_{n+1}(m)=[h(m)+R_n(m)]K+(1-K)H_n(m)$, in which:

$$R_n(m)=\Sigma^*[\Sigma m \Delta n(i) X_j(i)+S_j+N_j]X_j(i)/\Sigma^* X_j^2(m)$$

and $\Sigma^*$: Summation from J=nJ+1 to (n+1)J

Figure 8:
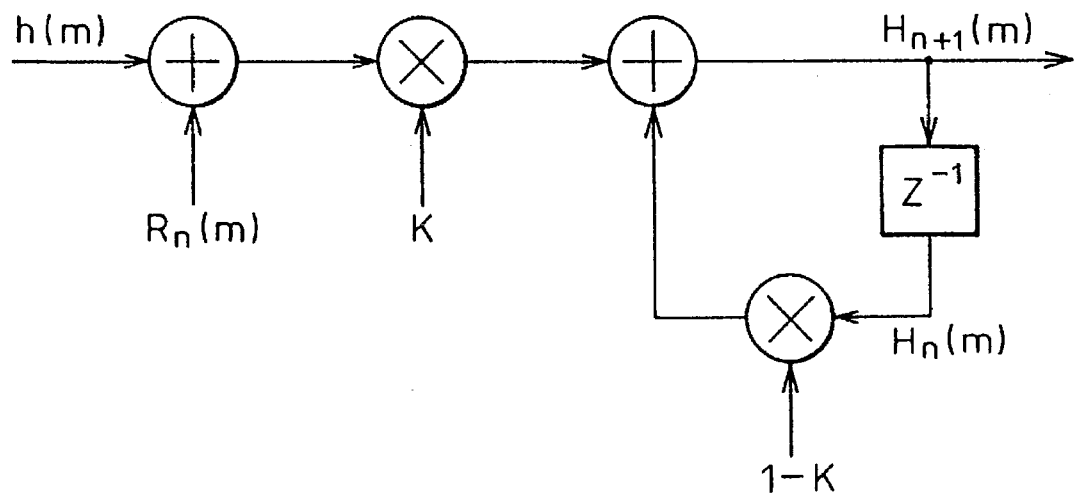
FIG. 8 is a drawing which shows the expression of a 1st-order recursive filter of the type of the present invention.

It is clear that equation constitutes a 1st order recursive filter with an input of the m-th sample value h(m) of the impulse response h(i) of the echo path, with the external noise being $R_n(i)$ which is made up of the prediction error $\Delta_n(i)$ which is related to the I≠m sample value. FIG. 8 is a block diagram which illustrates the structure of this calculation.

If, with respect to this structure, we assume that K<0, because the 1st order recursive part coefficient (1−K) is 1 or greater, the output of the filter, of course, exhibits divergence. If K=0, because the h(m) to the filter is blocked, the extraction of the coefficient $H_{n-1}(m)$ becomes impossible. That is, a required condition for stable execution of the updating of coefficients with the method of the present invention is that "the average power is reduced with respect to these two circulations." If the average power for the estimation error $\Delta_n(i)$ for all taps in the coefficient updating for the n-th block is expressed as $\sigma_n^2$, this condition can be expressed as an inequality.

First, if the assumption is made that the average power of the estimation error generated for one coefficient is $\sigma n^2$, it is possible to have the average power of the estimation error for (I–1) coefficients, which are returned to the input as external noise $R_n(m)$, be $\sigma_n^2(I-1)$. In addition, this power is reduced to $\sigma_n^2(I-1)/J$ as a result of the arithmetic averaging of the external noise $R_n(m)$, this being multiplied by the step gain K an ultimately returning to the output as the prediction error difference $K^2\sigma_n^2(I-1)/J$. The prediction error at the 1st order recursive part which is generated at tap m is multiplied by (1–K) and returned to the output, the average power thereof being expressed as $(1-K)^2\sigma_n^2$. The above condition consists, for these two circulations, of the inequality $$K^2(I-1)\sigma_n^2/J+(1-K)^2\sigma_n^2<\sigma_n^2.$$

That is, if the conditions $\sigma_n^2>0$ and $K>0$ are applied to this inequality, the above inequality can be simplified to the stability criterion $$0<K<2J/(I+J-1).$$

Next, let us consider the application of the above-described adaptive algorithm to an active noise control system. Specifically, as described in the section on the related art, it is possible to apply the filtered-X NLMS algorithm to an active noise control system. It will also be verified that the method of the present invention is applicable in the same manner.

Figure 1:
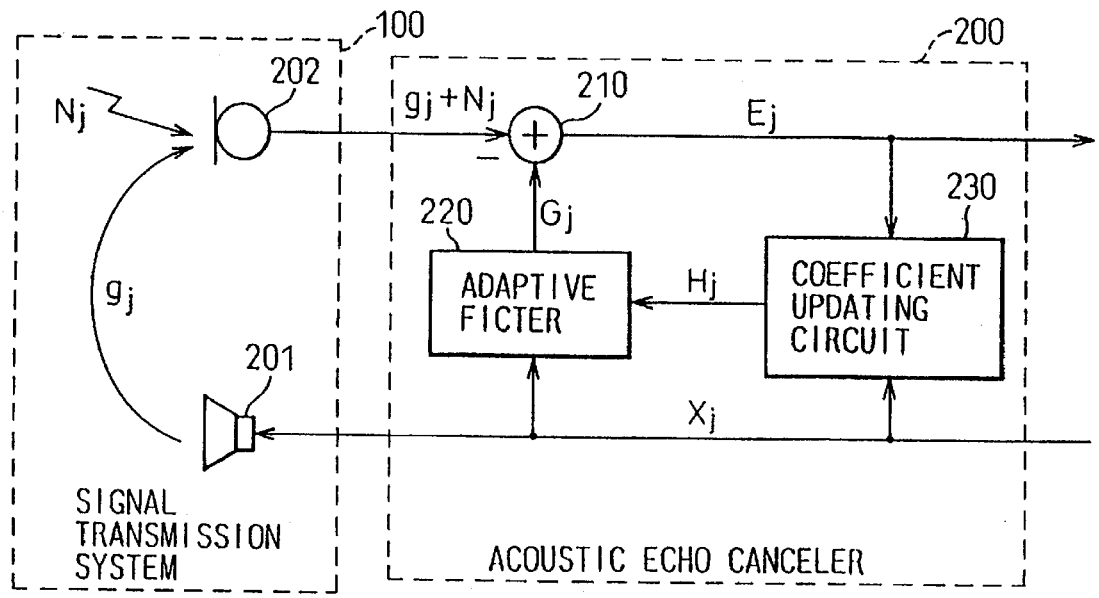
FIG. 1 is a drawing which shows an example of the configuration of a hands-free telephone
Figure 2:
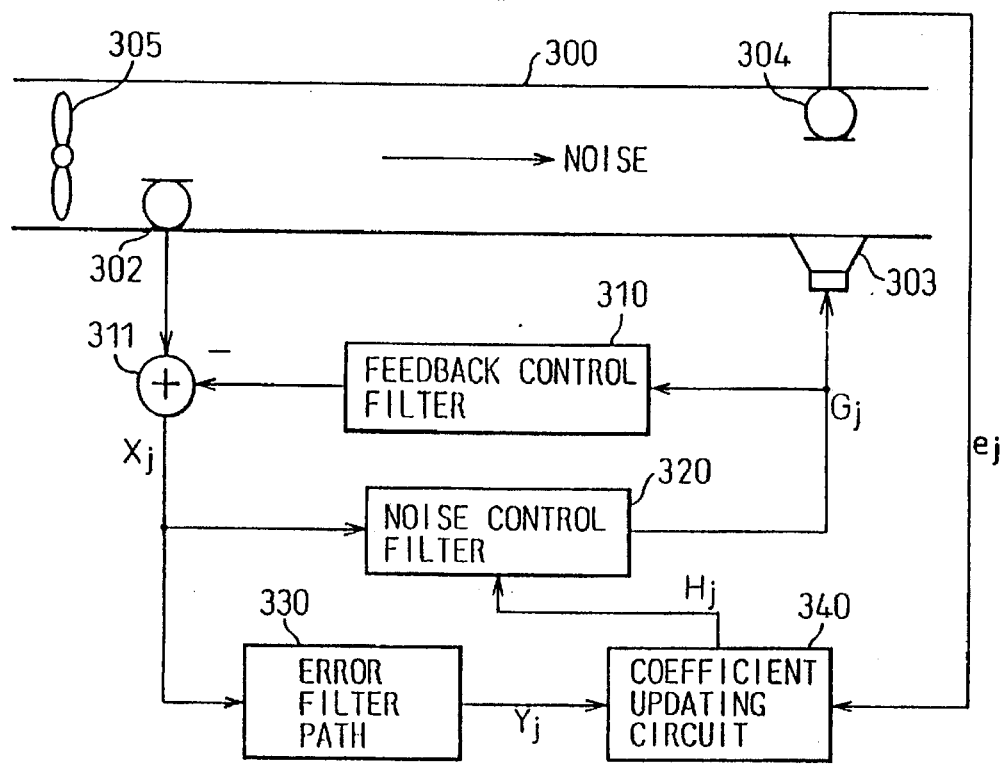
FIG. 2 is a drawing which shows an example of the configuration of an active noise control apparatus.
Figure 3:
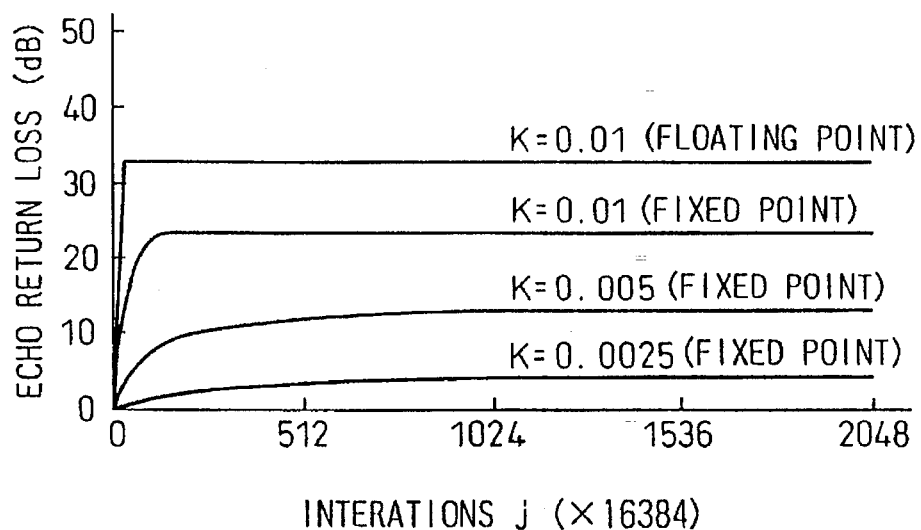
FIG. 3 is a drawing which illustrates the influence on convergence speed of using floating-point computation.
Figure 4:
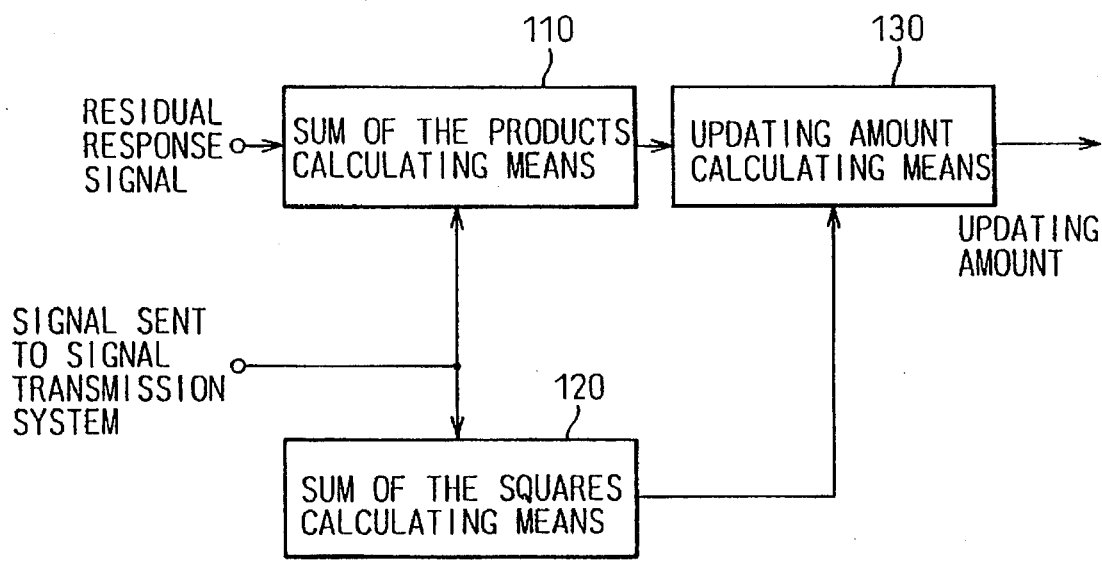
FIG. 4 is a drawing which illustrates the principle of the present invention.

First, if the coefficient of the prediction dispersion filter 330, which emulates the error dispersion system from the noise control filter 320 to the coefficient updating circuit 340 shown in FIG. 2 and the characteristic thereof is made a(t) (where t=1 to T), the output of the microphone 304 can be expressed as follows.

$$ej=\Sigma^T a(t)\Sigma[h(i)-Hj-t(i)]Xj-t(i) \quad (17)$$

In the above, $\Sigma^T$ is the summation from t=1 to T, this notation being used hereinafter. If this is expressed as in the learning identification algorithm, with the component related to tap m separated from other components, it is possible to express it as follows.

$$e_j = \Sigma^T a(t) \Sigma[h(m) - H_{j-t}(m)] X_{j-t}(m) + \Sigma^T a(t) \Sigma_m[h(i) - H_{j-t}(i)] X_{j-t}(i) \quad (18)$$

$\Sigma^T$: Summation from $t = 1$ to $T$
$\Sigma_m$: Summation from $i = 1$ to $I$, excluding $i = m$ Because the amount of change of a coefficient updating amount for one coefficient update is very small, it can be assumed that the amount of change for a number of coefficient updates is small, and if the filter coefficients Hj–t(m) are approximated by the constants $H_n(m)$ over the range j=nJ+1 to (n+1), Equation (18) can be rewritten as the following Equation (19).

$$\begin{aligned}e_j &= [h(m) - H_n(m)] \Sigma^T a(t) X_{j-t}(m) + \\&\quad \Sigma^T a(t) \Sigma_m [h(i) - H_{j-t}(i)] X_{j-t}(i) \\&= [h(m) - H_n(m)] Y_j(t) + \\&\quad \Sigma^T a(t) \Sigma_m [h(i) - H_{j-t}(i)] X_{j-t}(i)\end{aligned} \quad (19)$$

$\Sigma^T$: Summation from $t = 1$ to $T$

Therefore, based on this, the first term of the ratio of the two values given by Equations (20) and (21) is given as the difference between the coefficient predicted value and the true value, the same as in the learning identification algorithm.

$$B_n(m)=\Sigma^* ejYj(m) \quad (20)$$

$$Q_n(m)=\Sigma^* Yj^2(m) \quad (21)$$

$\Sigma^*$: Summation from J=nJ+1 to (n+1)J

That is, by performing the next coefficient update of $H_{n-1}(m)=H_n(m)+KB_n(m)/Q_n(m)$, the method of the present invention can be applied as well to the filtered-X NLMS algorithm which is used in the active noise control apparatus.

Next, the configuration of actual circuits used to implement the embodiment of the present invention will be described.

Figure 9:
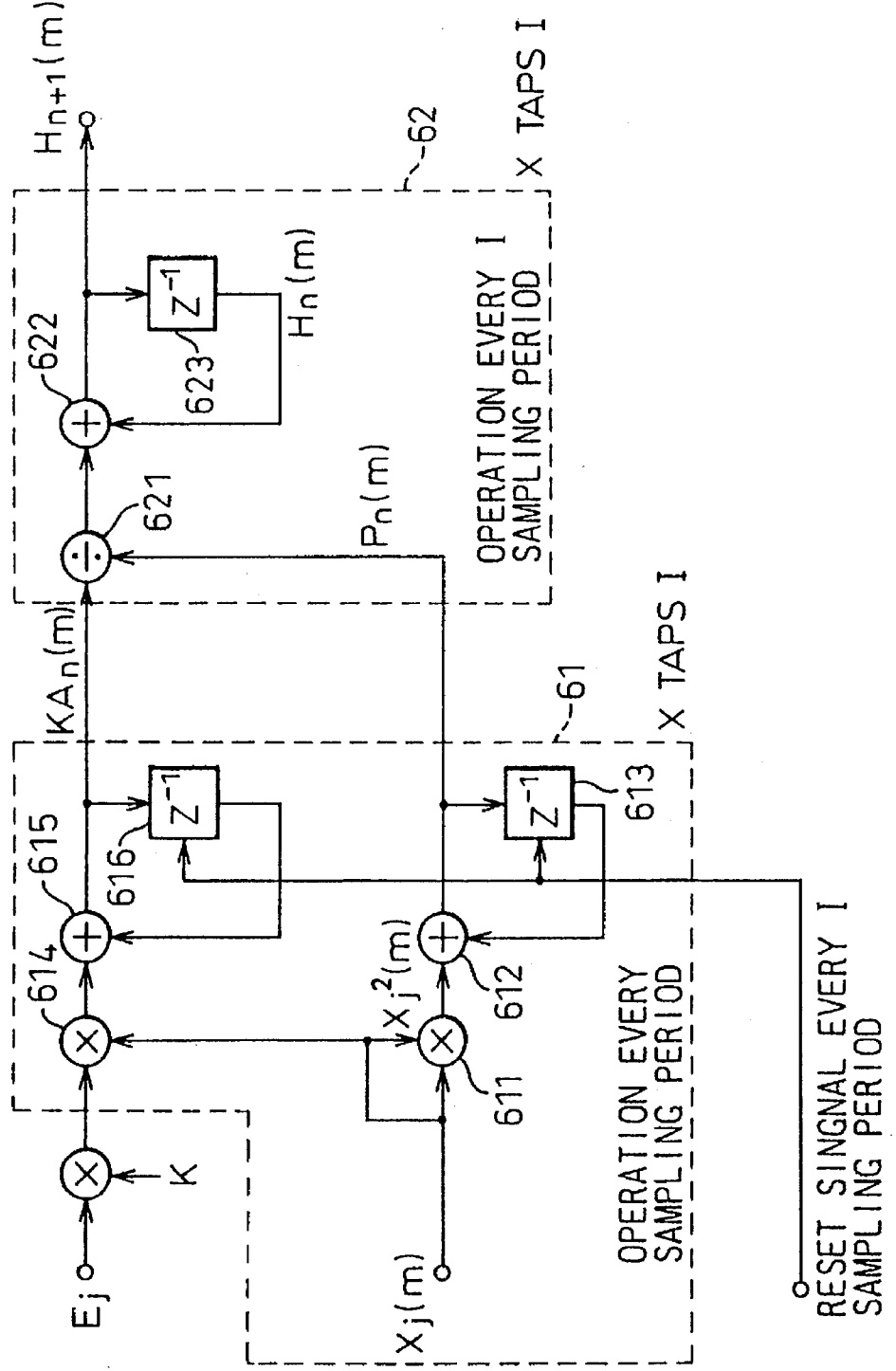
FIG. 9 shows an example of a coefficient updating circuit in the case in which the configuration is a simple implementation in accordance with the operating principle of the coefficient updating circuit of the present invention.

FIG. 9 is a simple circuit which is an implementation of the coefficient updating means according to the present invention. In FIG. 9, the block 61 denotes the part which calculates $KA_n(m)$ and $P_n(m)$ according to Equation (9) and Equation (10), this part including a multiplier 611 which calculates the square of the far-end party signal Xj(m), a delay element 613, an adder 612 which accumulates these multiplied values to arrive at $P_n(m)$, a multiplier 614 which multiplies KEj with Xj(m), and a delay element 616 and an adder 615 which accumulate these multiplied values to arrive at $KA_n(m)$. This block 61 operates each sampling period, during which the delay elements 613 and 616 are reset every I sampling periods. The calculation processing of the block 61 must be performed for each tap (1 to I) of the adaptive filter.

Block 62 operates every I sampling periods, and is the part that calculates the coefficients $H_{n-1}(m)$ to be updated, based on $KA_n(m)$ and $P_n(m)$. This block 62 includes a divider 621 which obtains the coefficient updating amount by dividing $KA_n(m)$ by $P_n(m)$, and an adder 622 and a delay element 623 which add this coefficient updating value to the previous coefficient $H_n(m)$. The calculation processing of the block 62 must performed, similarly to that for block 61, for each tap of the adaptive filter.

Figure 10:
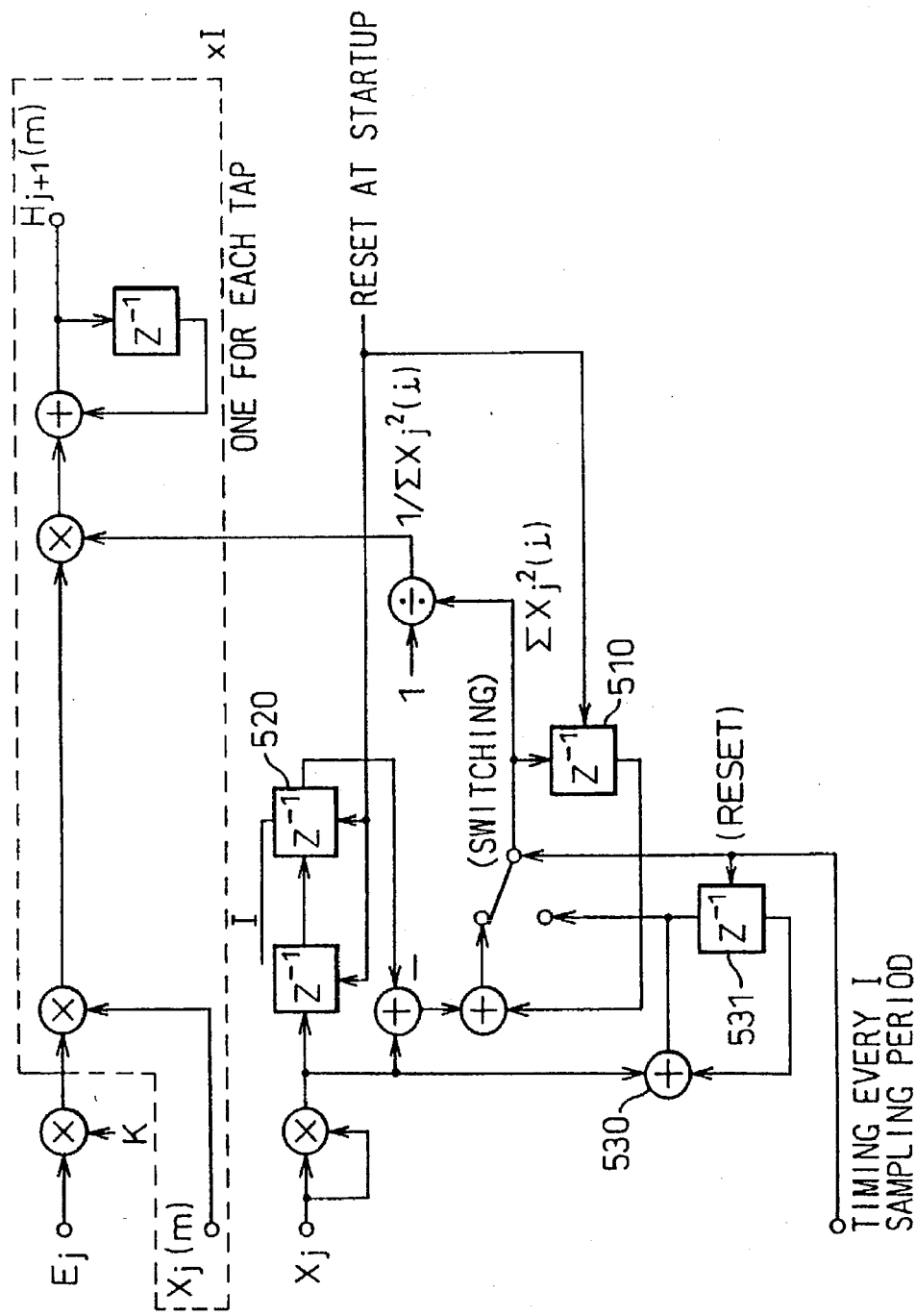
FIG. 10 shows an example of a coefficient updating circuit according to the learning identification algorithm of the prior art.

For a comparison with the circuit configuration of the method of the present invention, FIG. 10 indicates the circuit configuration which is generally used in accordance with the learning identification algorithm. In this circuit, the calculation of the norm in the learning identification algorithm is performed as follows to reduce the amount of computation. Specifically, the fact that Xj(i) becomes $X_{j-i+1}$ is used, the calculation of the norm at time j+1 being made as follows with respect to the norm $\Sigma Xj^2(i)$ obtained at time j, and the oldest square value $X_{j-I+1}^2(i)$ and the newest square value $X_{j+1}^2(i)$, which is input at time j+1, which are included therein.

$$\Sigma X_{j+1}^2(i)=\Sigma Xj^2(i)-Xj-I+1^2(i)+X_{j+i}^2(i)$$

Stated simply, if the norm which is required in coefficient updating by the learning identification algorithm is calculated in terms of $\Sigma Xj^2(i)$, it is clear from the Equation (22) that it is necessary to perform I squarings and additions for each sampling period.

$$\Sigma X_j^2(i) = X_j^2(1) + X_j^2(2) + X_j^2(3) \ldots + X_j^2(I) \quad (22)$$

However, in reality, the fact that the norm at the next time (j+1) is calculated as in Equation (23) is utilized to reduce the amount of computations.

$$\Sigma X_{j+1}^2(i)=X_j^2(1)+X_j^2(1)+X_j^2(2) \ldots +X_j^2(I-1) \quad (23)$$

FIG. 10 is an example of this configuration, in which separate shift registers 520 are provided, with a number of stages equal to the number of taps I, to hold the square values of the far-end party signal Xj, and in which the oldest square value with respect to the norm stored in register 510 (that is held in the last stage of the shift register) is subtracted, while the square value of the far-end talker's signal that is newly input (the input to the shift register 520) is added, so that the norm is updated every sampling period.

In this calculation method, however, the initial value stored in register 510 remains there forever, making necessary processing to reset register 510 and register 520 to 0 at the time of startup.

If the norm is calculated by floating-point computations, when values having differing exponents are added, because mantissa adjustment is performed to suit the larger value, an error occurs between the oldest square value which is to be shifted right and subtracted from the norm and the oldest square value which remains in the register as the norm value. If this error is ignored, it accumulates, so that the norm could diverge. Because of this situation, in the method shown in FIG. 10, a separate circuit formed by the adder 530 and the register 531 is provided to add a function that performs a simple calculation of the norm, and the operation of replacing the norm which is stored in register 510 with the results of that calculation is added, thereby preventing divergence of the norm.

If the circuit configuration and amount of computations of the method of the present invention and the learning identification algorithm are compared, they differ as follows for each I sampling periods. Firstly:

Learning identification algorithm (FIG. 10):

(I products of residual echo and the far-end talker's signal)+(1 squaring of the far-end talker's signal)+(1 right shift of the squared value in the shift register 520)+(1 subtraction of the oldest squared value)+(1 addition of the newest squared value)+(1 addition for the replacement norm in order to limit error accumulation)+(I additions for coefficient updating)+(1 division and 1 multiplication to normalize with respect to the norm)

Method of the present invention (FIG. 9):

(I products and I sums of residual echo and the far-end talker's signal)+(1 squaring of the far-end talker's signal)+(I additions of squared values)+(I additions for coefficient updating)+(I divisions to normalize with respect to the far-end talker's signal power)

That is, while the method of the present invention features simple calculations, the number of calculations is large. However, the "1 right shift of the far-end talker's signal" which corresponds to the "1 right shift of the squared value in the shift register" which is required in the learning identification algorithm is eliminated by sharing the shift register which forms the adaptive filter. The addition for the purpose of updating coefficients is performed one time each I sapling periods, this being the maximum amount of calculations.

In this manner, whereas the control and structure of the method of the present invention are simple, it has a problem in that the amount of calculation is large, and it is understood that the fact that the amount of calculation is large is due to the calculation of the normalized power at the execution of the division for each tap.

[1] Method 1 of simplifying the calculation of the far-end talker's signal Power $P_n(m)$ (claim 2).

Figure 11:
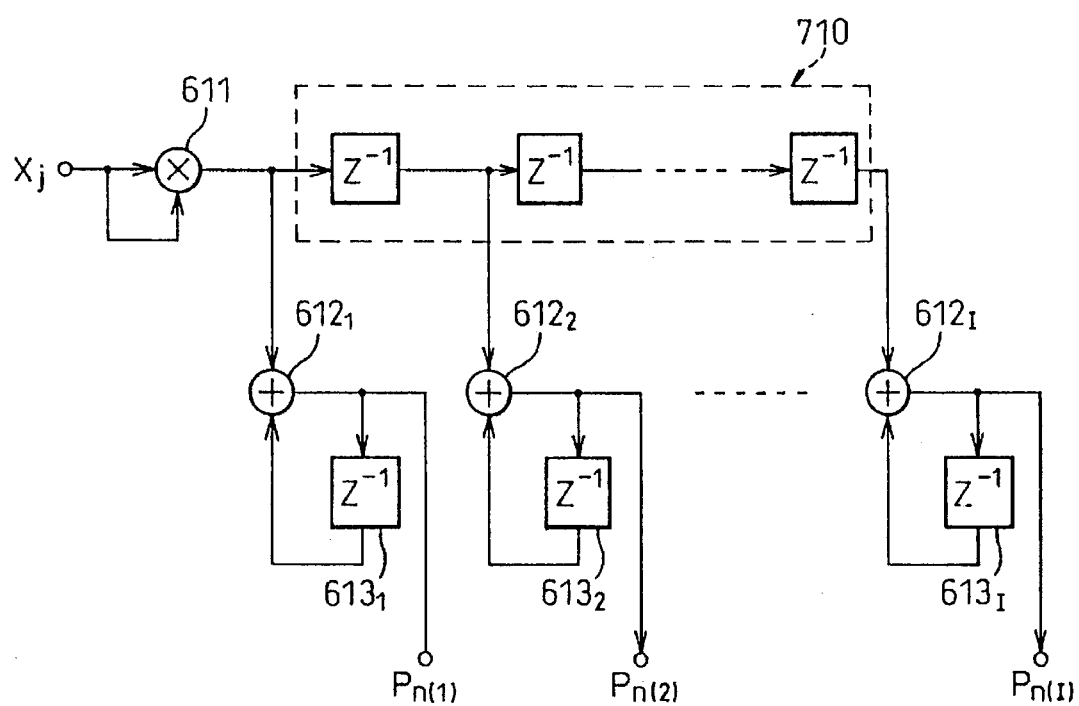
FIG. 11 shows an example of a circuit which performs a calculation of the far-end talker's signal power and can reduce the amount of computation in the present invention.

There is a method of configuration that reduces the amount of calculation in the method of the present invention. Specifically, it is the utilization of a shift register 710, which stores the squared values of the far-end talker's signal in the same manner as in FIG. 10 (claim 2). FIG. 11 shows the specific circuit configuration. Shift register 710 has (I−1) taps, a squared far-end talker's signal value being stored at each tap, these squared values being sequentially shifted at each sampling period. The output of each of the taps is input to an adder $612_i$ and a delay element $613_i$, which are provided for the purpose of calculating the accumulated value $P_n(i)$ of $Xj^2$ which corresponds to each tap of the adaptive filter.

According to this circuit configuration, which is shown in FIG. 11, the squaring calculation which was required for each tap becomes unnecessary. While an additional first right shift in the shift register which stores these squared values becomes necessary, the frequency of calculating "the square of the far-end talker's signal" is reduced to one time each sampling period.

[2] Method 2 of simplifying the calculation of the far-end talker's signal Power $P_n(m)$ (claims 3 and 4).

The essence of the above-described method of the present invention is the extraction of $h(m)-H_n(m)$ from the coefficient updating amounts $EjXj(m)$. In view of this point, even if the configuration is made such that the accumulation of the coefficient updating amounts $EjXj(m)$ and the calculation of the norm are delayed by the same amount of time, it is possible to extract the $h(m)-H_n(m)$. Additionally, if the configuration is made so that the execution of updating of each of the coefficients is delayed in this manner by one sampling period (claim 3), the execution of additions for the purpose of adaptive filter coefficient updating, which had been concentrated in one sampling period, are distributed over each sampling period, thereby greatly reducing the amount of calculation executed in any single sampling period.

In this manner, this configuration changes the configuration from the structure in which the execution of updating of coefficients of the adaptive filter was performed in a concentrated fashion in units of I sampling periods to one in which, for example, one coefficient updating is performed for one sampling period. By doing this, it is possible to expect a reduction in the amount of calculation performed due to the distribution of calculations so that the addition for coefficient updating and the division for normalization are performed only one time each sampling period.

If we note that the far-end talker's signal $Xj(i)$ can be, as noted above, written $X_{j-i+1}(i)$, Equations (15) and (16) can be rewritten as follows.

$$A_n(m) = [h(m) - H_n(m) \Sigma^* X^2_{j-m+1}(i) + \Sigma^*[\Sigma_a \Delta_j(i) X_{j-i+1}(i) + S_j + N_j]$$
$$X_{j-m+1}(i)$$
$$P_n(m) = \Sigma^{**} X^2_{j-m+1}(i)$$

Next, in order to have only one coefficient updated each sampling period, the addition range for each tap is changed, for example, for the tap m coefficient, to $j=nJ+1+m-1$ to $(n+1)J+m-1$, so that the calculation of the coefficient updating amount $[h(m)-H_n(m)]$ can be made as the ratio of the following two expressions.

$$A_n(m) = [h(m) - H_n(m) \Sigma^{**} X^2_{j-m+1}(i) + \Sigma^* Y[\Sigma_m \Delta_j(i) X_{j-i+1}(i) + S_j + N_j]$$
$$X_{j-m+1}(i)$$
$$P_n(m) = \Sigma^{**} X^2_{j-m+1}(i)$$

$\Sigma^{**}$: Summation from $j = nJ + 1 + m - 1$ to $(n + 1)J + m - 1$, this notation being followed hereinafter.

In doing this, the summation of the squared values of $X^2_{j-m+1}$ over the period $J+1+m-1$ to $(n+1)J+m-1$ at the time $j-m+1$, which is $m-1$ before the time $j$ on the right side of these equations becomes equal to the summation of $Xj^2(i)$ over the period $j=nj+1$ to $(n+1)J$. Therefore, the right side of the above equation for $P_n(m)$ can be rewritten as follows.

$\Sigma^{**} Xj-m+1^2(i) = \alpha^* Xj^2(i)$ $\Sigma^*$: Summation from $J=nJ+1$ to $(n+1)J$ $\Sigma^{**}$: Summation from $j=nJ+1+m-1$ to $(n+1)J+m-1$ This equation means that by using this equation, the normalized powers which are required for each coefficient can all be replaced by the summation of the squared value $Xj^2(i)$ over the period $J=nJ+1$ to $(n+1)J$, regardless of the tap.

Figure 12:
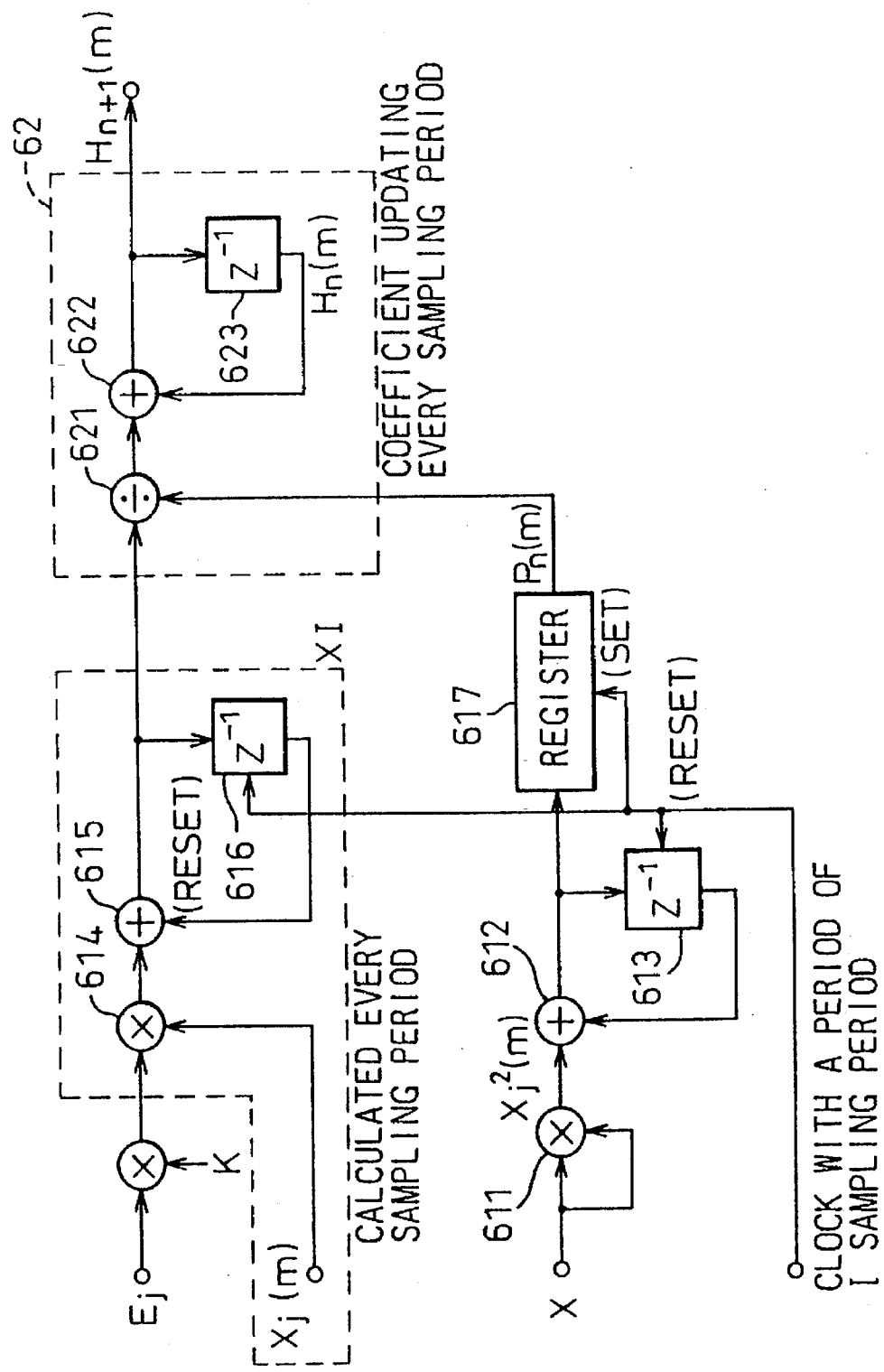
FIG. 12 shows an example of a circuit which updates I coefficients each sampling period and can reduce the amount of computation in the present invention.

FIG. 12 is an example of a circuit which shows how the amount of calculation can be greatly reduced when using what can be called the distributed updating method (or the moving average method (claim 4). This circuit differs from the circuit of FIG. 9, which was described above, in that the output of the circuit formed by the adder 612 and the delay element 613 is sent to the block 62 via a register 617, this register 617 being reset every I sapling periods.

In the example shown in FIG. 12, the power $P_n(m)$ of the far-end party signal is calculated by the multiplier 611, which squares the signal Xj, I of these squared value being accumulated by the adder 612 and delay element 613, the contents of the register 617 being replaced by the accumulation of these I values, the accumulated value of the delay element 613 being also reset to 0 every I sapling periods so as to be prepared for the next accumulation operation. In this case, because the power $P_n(m)$ in the register 617 is held for only I sampling periods, the updating of each of the filter coefficients is executed by means of the power $P_n(m)$ stored in this register 617 one at a time for each sampling period.

FIG. 13 is a comparison of the amount of calculation in the learning identification algorithm, the basic form of the method of the present invention, and the moving average form (distributed processing form) of the method of the present invention. It can be seen from the drawing that the above-described moving average form provides a great reduction in the amount of calculation.

Figure 14:
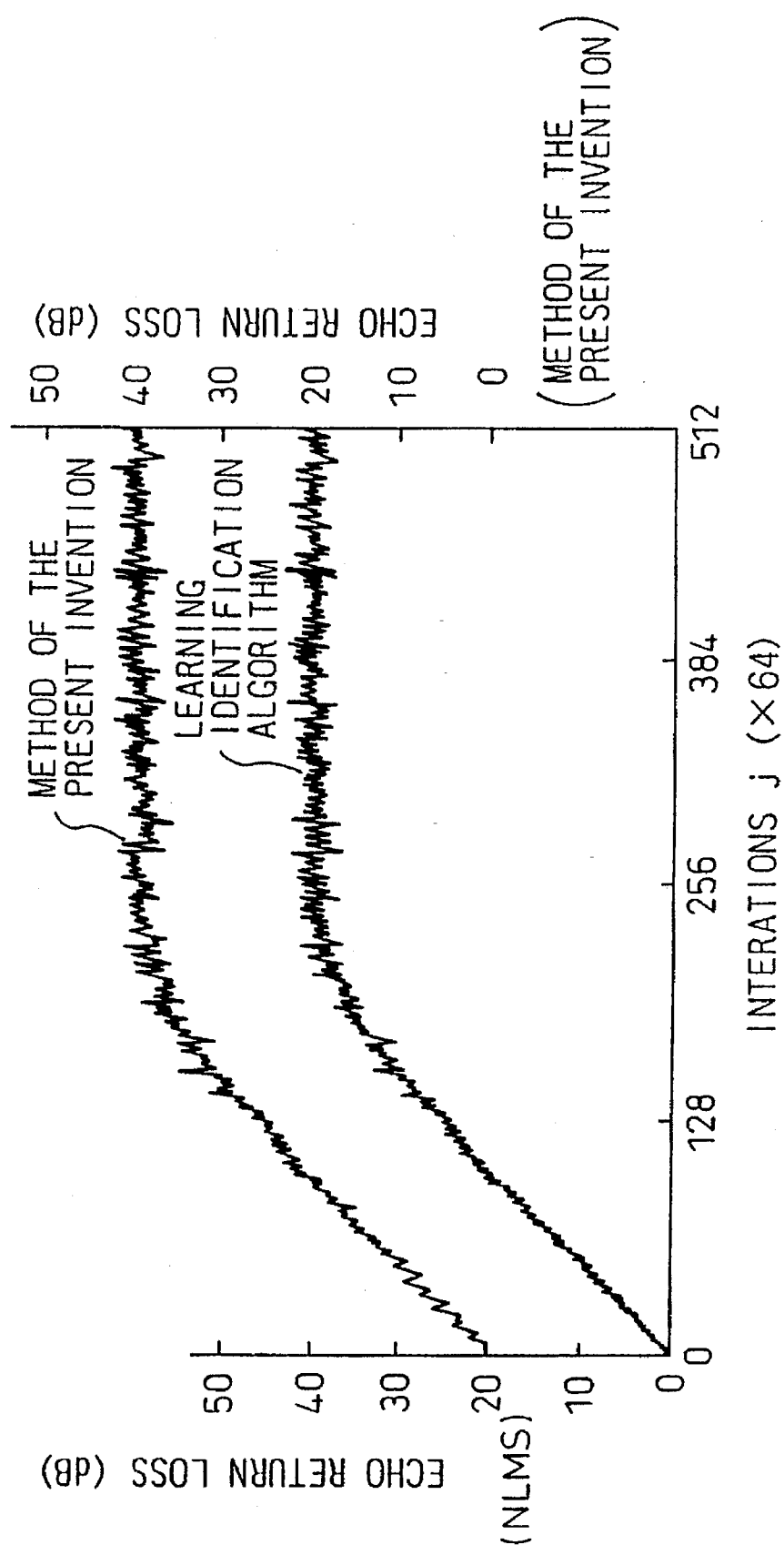
FIG. 14 is a drawing which shows an example of the convergence characteristics of the present invention with distributed updating.

FIG. 14 shows a simulation comparison of convergence characteristics of the method of the present invention using distributed processing with those of the learning identification algorithm. In this comparison, the number of taps and other conditions are the same as in the example given in FIG. 6. That is, in the simulation shown in FIG. 14, the convergence characteristics are calculated for a number of taps of the adaptive filter and an echo path impulse response length of I=512, a step gain of K=0.2, and an echo-to-environmental noise ratio of 30 dB. The echo reduction amount is indicated as the average value obtained by averaging over 64 sampling periods. The results of this simulation provide verification that there is almost no difference in the convergence characteristics between the two methods. However, similar to the case of FIG. 6, because the convergence characteristics virtually coincide and defy mutual distinction, the convergence characteristics for the present invention are offset by 20 dB. The results shown in FIG. 14 provide proof that the method of the present invention offers characteristics that are equivalent to those of the learning identification algorithm.

[3] Method of simplifying the division by the far-end party signal Power $P_n(m)$ (claim 5).

If, with respect to the configuration shown in FIG. 12, the configuration is made such that the reciprocal of the accumulated value is stored in a register, it is possible to substitute a multiplication operation for the operation of dividing by the far-end talker's signal power $P_n(m)$, similar to the case of the learning identification algorithm. As a result, the amount of calculation for the method of the present invention is reduced to the following.

(I products and I sums of residual echo and the far-end talker's signal)+(1 squaring of the far-end talker's signal)+(I additions of squared values)+(1 addition for the squared value)+(I additions for coefficient updating)+(1 division and one multiplication for normalization with respect to the norm)

The comparison of this amount of calculation with the amount of calculation with the learning identification algorithm is as follows.

I multiplications for normalization with respect to the norm: reduced to 1 multiplication.

1 right shift of the squared value: reduced to 0 shifts (and the need for a shift register is eliminated).

1 subtraction of the oldest squared value: reduced to 0 subtractions.

1 addition of the newest squared value: reduced to 0 additions.

1 addition for the replacement norm in order to limit error accumulation): reduced to 0 additions.

I additions for coefficient updating: reduced to 1 addition.

In addition to the above, the "resetting of the shift register and register to 0 at startup" becomes unnecessary.

[4] Achieving echo reduction (claim 6).

In the learning identification algorithm, stable operation is guaranteed with a fixed step gain, even if the far-end talker's signal power varies. However, after convergence, the prediction error is given by Equation (24).

$$P_D = KP_N[P_x(2-K)] \tag{24}$$

Because of this, it is clear that the prediction accuracy varies up and down in proportion to the variation in the far-end talker's signal power.

Specifically, from Equation (24), if the far-end talker's signal power is smaller than the power enabling the achievement of the desired echo reduction amount, the estimation error increases, this resulting in a reduction of the amount of echo reduction, and a destabilizing of the coefficient updating operation. Because of this problem, in an echo canceler for which the learning identification algorithm is used as an adaptive algorithm, if the far-end talker's signal power falls below the power which enables achievement of the required amount of echo reduction, there is generally an additional operation which inhibits the coefficient updating. However, the inhibiting of the coefficient updating constitutes a delay in tracking the variation in the echo path, this leading to an increase in the amount of time required for the amount of echo reduction to reach the required level, this increasing the risk of the generation of howling.

In the method of the present invention, however, there is no need to have the calculation of the normalization power $P_n(m)$ limited by the number of taps on the adaptive filter, so that for the accumulation calculation of the coefficient updating amounts EjXj(m) it is sufficient to extract h(m)–$H_n(m)$. Using the minimum amount of far-end talker's signal power (the power at which the coefficient updating is inhibited in the learning identification algorithm) to achieve the required echo reduction amount with respect to a given environmental noise power as a reference, if the configuration is such that when the power $P_n(m)$ exceeds this reference the coefficient updating is executed, it is possible to have a configuration in which not only is the required amount of echo reduction achieved even if the far-end talker's signal power is reduced, but also in which the updating of coefficients can always be performed.

Figure 15:
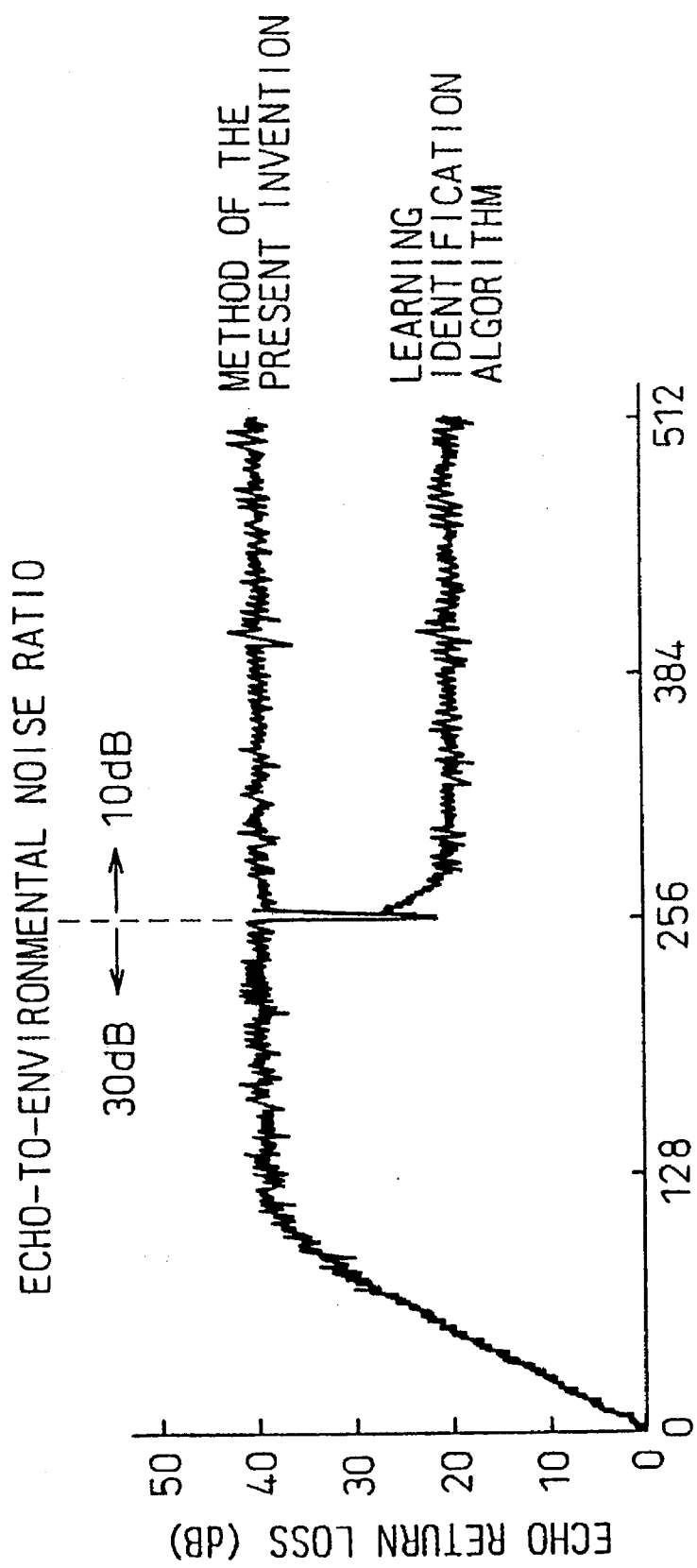
FIG. 15 is a drawing which shows, for the present invention and the learning identification algorithm, the variation characteristics of the echo reduction amount with respect to the reduction in the ratio of the echo to ambient noise.

FIG. 15 shows the calculated convergence characteristics at a step gain and reference power $P_o$ to achieve an echo reduction amount of 40 dB at a echo-to-environmental noise ratio of 30 dB. In the learning identification algorithm, while in the range in which the echo-to-environmental noise ratio is 30 dB, an echo reduction of 40 dB is achieved, the amount of echo reduction drops to 20 dB when the echo-to-environmental noise ratio becomes 10 dB. In contrast to this, with the method of the present invention, it can be seen that an echo reduction amount of 40 dB is achieved, regardless of the echo-to-environmental noise ratio.

[5] Improvement in convergence speed (claim 7).

In the learning identification algorithm, because the convergence speed is established by the step gain, even if the far-end talker's signal power exceeds the above-noted minimum value, the convergence speed does not change. In the method of the present invention, however, the convergence speed increases. That is, when the far-end talker's signal power becomes larger than this minimum value, because $P_n(m)$ exceeds the reference power for executing the coefficient updating with a smaller number of additions, the coefficient updating is executed more quickly, thereby improving the convergence speed.

Figure 16:
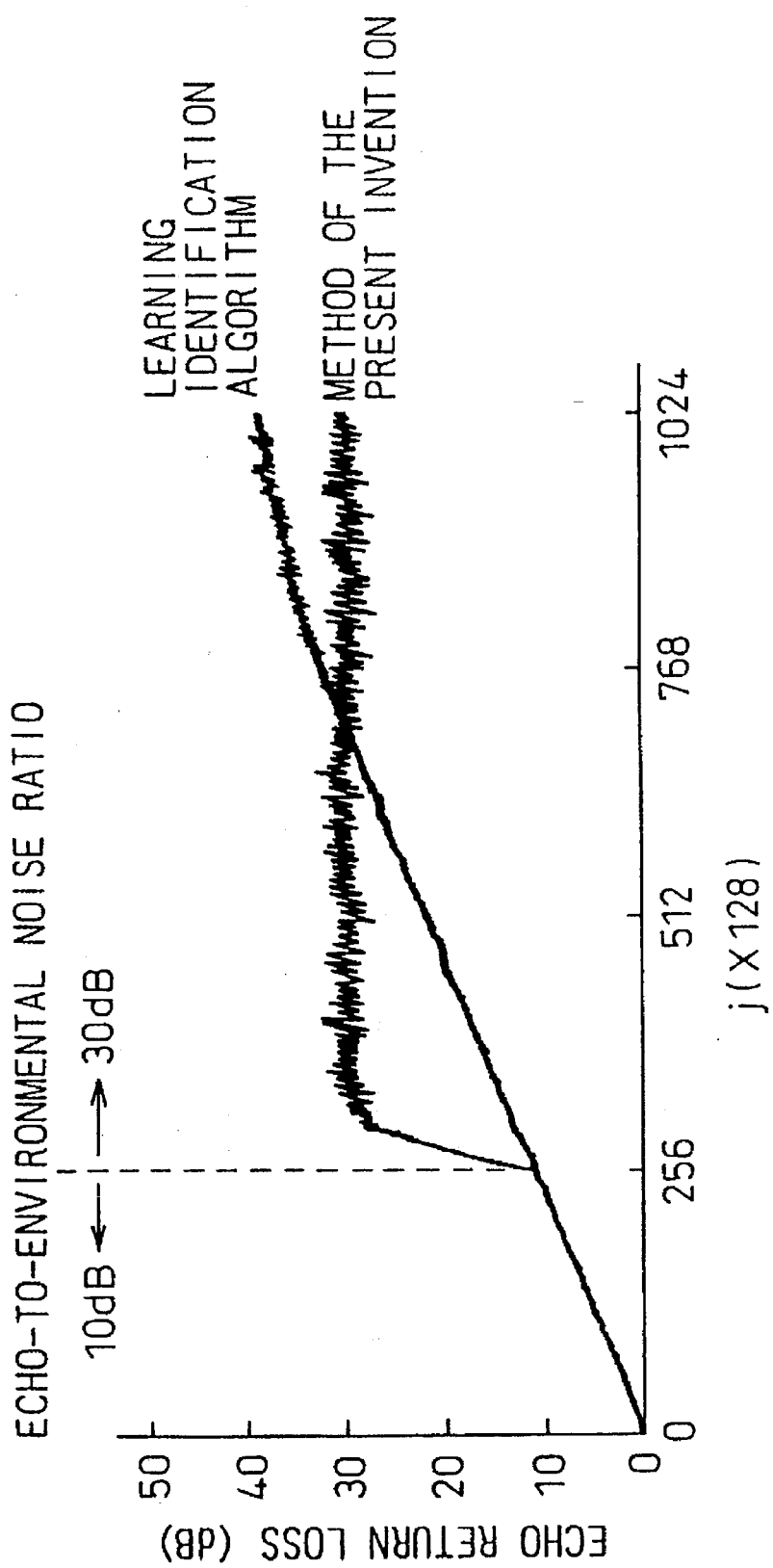
FIG. 16 is a drawing which shows, for the present invention and the learning identification algorithm, the difference in convergence characteristics with respect to the increase in the ratio of the echo to ambient noise.

FIG. 16 shows the convergence characteristics obtained at a step gain and reference power $P_o$ to achieve an echo reduction amount of 30 dB at a echo-to-environmental noise ratio of 10 dB, with the echo-to-environmental noise ratio increased to 30 dB at the time j=256×128. In the method of the present invention, if there is an increase in the far-end talker's signal power, the convergence speed is improved, enabling quick achievement of the required amount of echo reduction. In contrast to this, with the learning identification algorithm, even if the power of the far-end talker's signal increases, it can be seen that the convergence speed does not change, and the increase in power of the far-end talker's signal having no influence on the increase in the amount of echo reduction. However, this increase merely means that the amount of echo reduction is greater than the required amount, and in an echo canceler this merely means that excessive quality has been achieved.

However, when the power of the far-end talker's signal becomes larger than the reference power $P_o$, the number of calculations to calculate $P_n(m)$ is reduced, there arising in this case the possibility that it is not possible for $P_n(m)$ to limit the size of the denominator of the second term of Equation (16), which gives the prediction error, this leading to unstable coefficient updating. To achieve stable operation, the estimation error which is included in the coefficient updating amount $KA_n(m)/P_n(m)$ must not be allowed to become as large as the estimation error which is included in the coefficient updating amount $2EjXj(m)/\Sigma Xj^2(i)$ obtained at the upper limit of K=2 of the stability criterion of 0<K<2 established for the learning identification algorithm. In the learning identification algorithm, it is known that step gain at which the convergence speed is fastest is K=1, and that at K>1 the estimation error increases, so that, with the goal of achieving a high convergence speed, it can be said that it is desirable that the step gain K be less than the estimation error which is included in the coefficient updating amount $EjXj(m)/\Sigma Xj^2(i)$. That is, that the condition $P_n(m)/K \geq \Sigma Xj^2(i)$ be satisfied. Taking into consideration the fact that the execution of coefficient updating is based on the reference power $P_o$, it is possible to restate this condition as follows.

$$P_o/K \geq \Sigma Xj^2(i)$$

In this case, if the far-end talker's signal power squared value reaches the reference power $P_0$ at the L-th summation, if the mean of the squared values of the far-end talker's signal is $\sigma_x^2$, this relationship is equivalent to the following.

$$\sigma_x^2 L/K \geq \sigma_x^2 l \qquad (25)$$

That is, the number of summations, L must be as follows.

$$L \geq Kl \qquad (26)$$

This means, as a result that the lower limit of the number of summations must be limited to KI.

[6] Circuit configuration for the method of establishing the number of summations from the summed value (claim 8).

Figure 17:
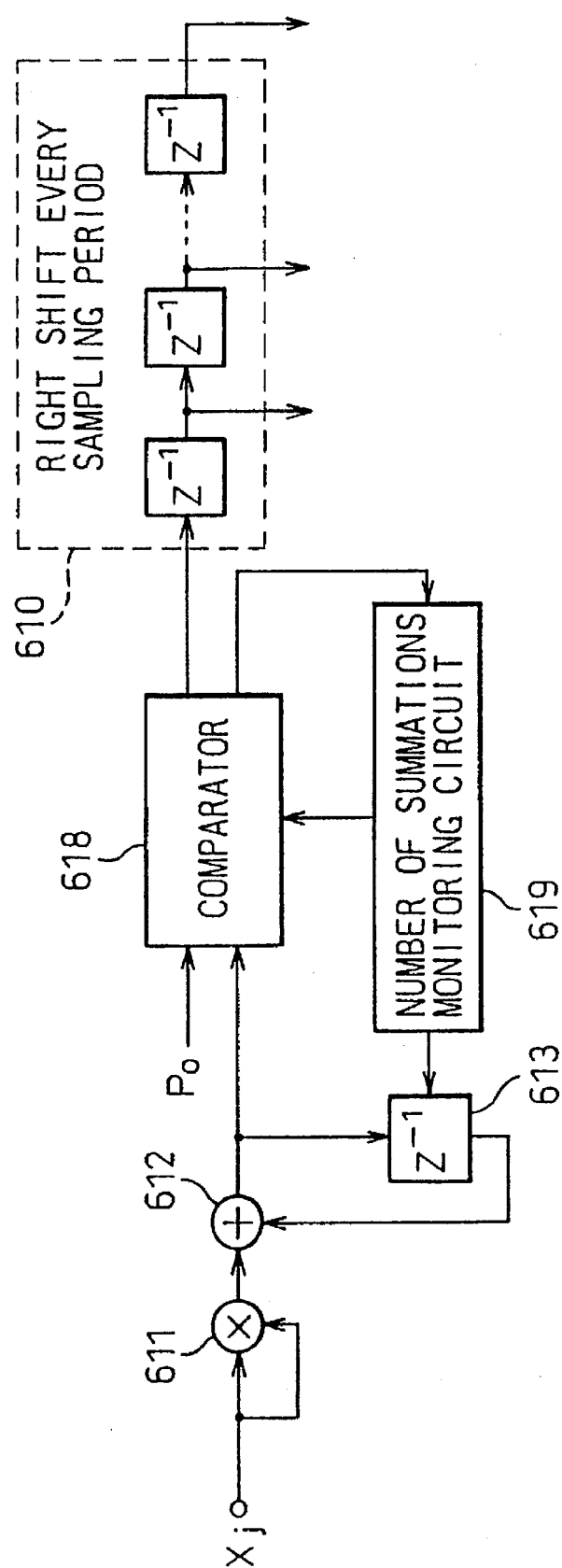
FIG. 17 is a drawing which shows an example of a simplified circuit for performing normalized power calculation.

FIG. 17 shows a circuit which establishes the number of summations from the summed value. In this drawing, the multiplier 611 calculates the square of the far-end talker's signal Xj, the adder 612 and the delay element 613 accumulate these squared values, the comparator 618 compares this accumulated value with the reference power $P_0$ and outputs either the summed value $P_n(m)$ (or $P_0$) or 0 to the shift register 610, which is described later, the number of summations monitoring circuit 619 counts the number of summation of the squared value of the far-end talker's signal and, when the reference power is exceeded at less than KI summations, instructs the comparator 618 to inhibit the writing of the sum $P_n(m)$ of squared values or $P_0$, the output of each tap of the shift register 610 corresponding to each coefficient of the adaptive filter.

In this circuit, when performing coefficient updating, in the case in which the tap output of the shift register 610 is monitored each sampling period and coefficient updating is not executed but the normalizing power $P_n(m)$ (or $P_0$) is stored, when this is 0, by executing the coefficient updating, it is possible to simplify the calculation of this normalizing power. Specifically, in FIG. 17, at the point at which the sum of the squares of the far-end talker's signal exceeds the reference power $P_0$, this sum $P_n(m)$ (or $P_0$) is written into the shift register 610, and when it has not reached that level, 0 is written into the shift register 610. To prevent divergence of the coefficient updating, simultaneous with the above, the number of summations of the squared values of the far-end talker's signal is monitored by the number of summations monitoring circuit 619, and if the reference power $P_0$ is exceeded at fewer than KI summations, notification of this is given to the comparator 618, thereby preventing the writing of the sum $P_n(m)$ of the squared values (or $P_0$) into the shift register 610. In this case, if the value written into the shift register of FIG. 17 is the reciprocal of the normalizing power, it is possible to replace the division operation with a multiplication operation.

[7] Method of indicating the timing for coefficient updating by means of a register into which is stored a flag (claim 9).

Figure 18:
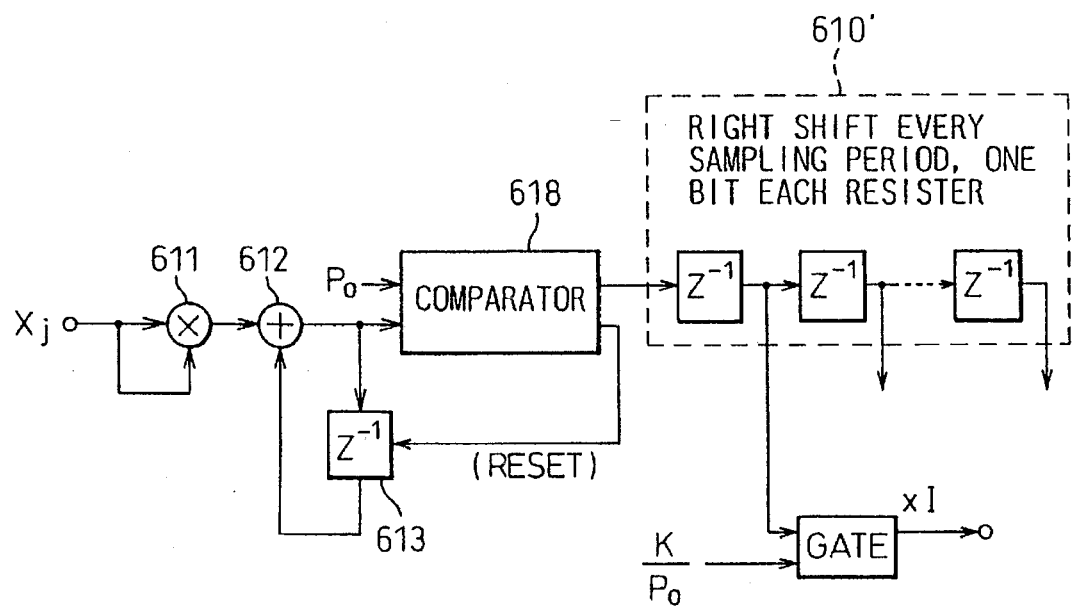
FIG. 18 is a drawing which shows an example of a circuit which performs normalization using a constant as the normalizing power.

FIG. 18 shows an example of the configuration of a circuit in which a register into which is stored a flag indicates the timing for coefficient updating.

By setting the step gain to a small value, even if the far-end talker's signal amplitude becomes large, it is possible to give the normalizing power as $P_0$, if each signal level is adjusted so that the number of summations of the far-end talker's signal does not exceed KI. In this case, since the reciprocal thereof is a constant, there is no need to store either $P_0$ or the reciprocal thereof. In short, it is merely necessary to clearly indicate when coefficient updating is to be executed and, as long as this timing is known, it is possible to calculate the coefficient updating amount using a separately provided reciprocal. That is, a shift register 610', such as shown in FIG. 18, into which is stored a single-bit coefficient updating flag is a sufficient tool for providing notification of this timing. If, instead of the reciprocal, a constant which is multiplied by the step gain is made available, the multiplication by the step gain is also made unnecessary.

[8] Simplification of the normalization calculation (claim 10).

It is clear that if it is possible, as discussed in (7) above, to perform the normalization using a constant if the magnitude of the reference power is established so that $K/P_0$ is in the form $2^k$ and a shift operation is all that the normalization calculation requires.

[9] Method 1 of making the timing of the coefficient updating an integral multiple of the number of taps (claim 11).

First, when the lower limit of the number of summation is given as the number taps of the adaptive filter, the maximum value expected to be derived from I summations of the far-end talker's signal is given as $P_m$, and the sum of the squared values thereof to achieve the required estimation accuracy given as $P_0$, the step gain K is given as $P_m/(KP_0)$, which is a positive integer. Next, by setting the period for writing the sum $P_n$ of the far-end talker's signal into the register as I sampling periods, when this sum $P_n$ does not coincide with or exceed $P_m$ before the time for writing is reached, control is performed to delay the writing until the next writing time. In this case, because the coefficient updating is performed every integral multiple of I sampling periods, the shift register, shown in FIG. 17, which stores $P_n$ can serve as the register shown in FIG. 12. Of course, it is possible to store $KP_n$ instead of $P_n$.

[10] Method 2 of making the timing of the coefficient updating an integral multiple of the number of taps (claim 12).

In the above-noted method (claim 11), the sum $P_n(m)$ of squared values of the far-end talker's signal which is stored in a register is $P_m$ when the sum $P_n(m)$ is precisely equal to the maximum value $P_m$ at the time for writing into the register, and at other times, the it is a value within the range $P_m < P_n < 2P_m$. In an example in which the speed of convergence is not of concern, for example in an active noise control apparatus, it is possible to make the coefficient updating at the above-noted upper limit of $2P_n(m)$. This value of $2P_n(m)$ is one that can be established beforehand, and it is possible to change the form so that $2KP_n(m)$ is stored, or to given this as an approximation in the form $2^k$ or $2^{-k}$.

[11] Method of preventing the summed value from overflowing (claim 13).

When the calculation of the summed value $A_n(m)$ or $P_n(m)$ is made using fixed-point processing, and when the number of additions J becomes large, the chance of overflow increases. To solve this problem, both the summed values $A_n(m)$ and $P_n(m)$, or $P_n(m)$ alone, can be monitored, and if an overflow due to the addition of the component $EjXj(m)$ or $Xj^2(m)$ is detected, the summed values $A_n(m)$ and $P_n(m)$ are halved, and the subsequent components $EjXj(m)$ or $Xj^2(m)$ are multiplied by $\frac{1}{2}^k$, in which k is the number of overflows. This configuration prevents erroneous operation due to overflow of the summed values $A_n(m)$ and $P_n(m)$.

As described above, according to the present invention, even if there is a limited calculation word length, it is possible to implement an updating apparatus capable of adaptive filter coefficient updating which makes effective use of the coefficient updating amounts.

By doing this, it is possible to use a fixed-point type signal processor for the coefficient updating algorithm, and further possible to implement a low-cost apparatus which meets the requirements of high convergence speed, stability, and a reduction in the number of calculations performed.

What is claimed is:

1. A estimation apparatus which estimates filter coefficients for a filter which outputs a signal with a response that is equivalent to the signal transmission characteristics from a known signal and the response thereto which are sent to a signal transmission system of unknown characteristics, said prediction apparatus comprising:

a sum of the products calculating means which accumulates, over a prescribed period of time, the product of the difference between said signal transmission system response and said filter response, and said signal sent to the signal transmission system;

a sum of the squares calculating means which accumulates, over said prescribed period of time, the sum of the squares of said signal sent to the signal transmission system; and a updating amount calculating means which calculates said filter coefficient updating values from the results of said sum of the products calculating means and the results of said sum of the squares calculating means, said filter coefficient updating amounts which are calculated by said updating amount calculating means being used to update said filter coefficients.

2. A filter coefficient estimation means according to claim 1, wherein said sum of the squares calculating means comprises a shift register which sequentially stores squared values of said signal sent to said signal transmission system, each of the tap outputs said shift register being accumulated to obtain an accumulated sum of said squared values which is used in calculating said filter coefficient of each tap.

3. A filter coefficient estimation means according to claim 1, wherein said filter coefficient updating is performed for one tap each prescribed number of sampling periods.

4. A filter coefficient estimation means according to claim 3, wherein said sum of the squares calculating means comprises a register which stores the accumulated sum of the square values of said signal for an amount of time corresponding to the number of taps of said filter, said coefficient of each tap of said filter being updated based on the contents of said register.

5. A filter coefficient estimation means according to claim 4, wherein, instead of said sum of the squares of said signal sent to said signal transmission system being stored, the reciprocal thereof is stored.

6. A filter coefficient estimation means according to claim 1, wherein said prescribed time is the time until the sum of the squares of said signal output to said signal transmission system reaches a prescribed size.

7. A filter coefficient estimation means according to claim 1, wherein with respect to a number of summations appropriate to said prescribed time for summation of squared values of said signal sent to said signal transmission system, the product of step gain and a number of taps is set as a lower limit.

8. A filter coefficient estimation means according to claim 7, comprising a shift register which holds values related to the sum of squared values calculated by said sum of the squares calculating means, and a control means which, when the sum of the squares calculated by said sum of the squares calculating means does not reach a prescribed value, issues a non-update instruction to said shift register, and which, when the sum of the squares calculated by said sum of the squares calculating means does reach said prescribed values, performs control so that the values related to the sum of squared values are written, the updating of the coefficients at each tap of said filter being performed by monitoring the tap outputs of said shift register, execution of updating being done when the contents thereof are values related to the sum of squared values, but execution of coefficient updating not being done if the contents are a non-update instruction.

9. A filter coefficient estimation means according to claim 6, comprising a shift register which stores a flag which is set when the sum of squared values of said signal reaches a pre-established size, said shift register acting as a device to give notification of the timing of execution of summation, the timing of execution of filter coefficient updating being known by means of said flag, coefficient updating being performed by dividing by said pre-established size of said sum of the squares or multiplying by the reciprocal thereof.

10. A filter coefficient estimation means according to claim 9, wherein the quantity for division or multiplication is given in the form $2^k$ or $2^{-k}$.

11. A filter coefficient estimation means according to claim 1, wherein the step gain is established such that the ratio of the maximum value of the result of summing of the squares of said signal sent to said signal transmission system a number of times which is equal to the number of taps of the adaptive filter, to the product of the expected sum of the squares for the desired estimation accuracy and the step gain is an integer, a register being provided for writing the sum of the squares of said signal sent to said signal transmission system required for the coefficient updating or the reciprocal of said value, the contents of said register being updated every I sampling periods, which corresponds to the number of taps I of said adaptive filter, and execution being done in the case in which, at the time of the updating of the register contents, the sum of the squares of said signal sent to said signal transmission system has either reached or exceeded said maximum value.

12. A filter coefficient estimation means according to claim 11, wherein all the sums of the squared values stored in said register are given as integral multiples of said maximum value.

13. A filter coefficient estimation means according to claim 11, wherein overflow monitoring is performed with respect to the sum of the products of said sum of the products calculating means and the sum of the squares of said sum of the squares calculating means, or only with respect to the said sum of the squares calculating means, the sum of the products and the sum of the squares being halved when overflow of a monitored quantity is either predicted or detected, subsequent components to be added being multiplied by $½^k$, which is established by the number of predicted or detected times k.

14. A filter coefficient estimation method in which filter coefficients are predicted for a filter which outputs with a response that is equivalent to the signal transmission characteristics from a known signal and the response thereto which are sent to a signal transmission system of unknown characteristics, said estimation method comprising:

a step for the calculation of coefficient updating amounts for said filter from the ratio of the results of accumulating, over a prescribed period of time, the difference between the said signal transmission system response and the output of said filter to the result of accumulating, over said prescribed period of time, the squared values of the signal sent to said signal transmission system, and a step for said calculated values being added to said filter coefficients, which are separately stored, to update said calculated value, said steps operations being repeated.

* * * * *